(12) United States Patent
Kim et al.

(10) Patent No.: US 11,984,507 B2
(45) Date of Patent: May 14, 2024

(54) SEMICONDUCTOR DEVICES

(71) Applicant: SAMSUNG ELECTRONICS CO., LTD., Suwon-si (KR)

(72) Inventors: Dongwoo Kim, Incheon (KR); Jinbum Kim, Seoul (KR); Gyeom Kim, Hwaseong-si (KR); Dohee Kim, Seoul (KR); Seunghun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 17/206,229

(22) Filed: Mar. 19, 2021

(65) Prior Publication Data

US 2022/0069134 A1    Mar. 3, 2022

(30) Foreign Application Priority Data

Aug. 28, 2020  (KR) .......................... 10-2020-0109329

(51) Int. Cl.
*H01L 29/78*        (2006.01)
*H01L 21/02*        (2006.01)
(Continued)

(52) U.S. Cl.
CPC .. *H01L 29/78618* (2013.01); *H01L 21/02532* (2013.01); *H01L 21/02603* (2013.01);
(Continued)

(58) Field of Classification Search
CPC ......... H01L 29/78618; H01L 21/02532; H01L 21/02603; H01L 29/0673; H01L 29/161; H01L 29/41733; H01L 29/42392; H01L 29/66545; H01L 29/66636; H01L 29/66742; H01L 29/78696; H01L 29/41766; H01L 29/0847; H01L 29/66439;
(Continued)

(56) References Cited

U.S. PATENT DOCUMENTS 8,518,785 B2    8/2013  Shimamune et al.
10,490,661 B2   11/2019  Ma et al.
(Continued)

FOREIGN PATENT DOCUMENTS

CN    106783625 A  *  5/2017  ....... H01L 29/66795
CN    109427588 A  *  3/2019  ............. B82Y 10/00

*Primary Examiner* — Samuel Park
*Assistant Examiner* — Ceyhan Gary Beckham
(74) *Attorney, Agent, or Firm* — Fish & Richardson P.C.

(57) ABSTRACT

A semiconductor device including an active region extending in a first direction on a substrate; channel layers vertically spaced apart on the active region; a gate structure extending in a second direction and intersecting the active region, the gate structure surrounding the channel layers; a source/drain region on the active region in contact with the channel layers; and a contact plug connected to the source/drain region, wherein the source/drain region includes a first epitaxial layer on side surfaces of the channel layers and including a first impurity; a second epitaxial layer on the first epitaxial layer and including the first impurity and a second impurity; and a third epitaxial layer on the second epitaxial layer and including the first impurity, and in a horizontal sectional view, the second epitaxial layer includes a peripheral portion having a thickness in the first direction that increases along the second direction.

17 Claims, 27 Drawing Sheets

(51) Int. Cl.
*H01L 29/06* (2006.01)
*H01L 29/161* (2006.01)
*H01L 29/417* (2006.01)
*H01L 29/423* (2006.01)
*H01L 29/66* (2006.01)
*H01L 29/786* (2006.01)

(52) U.S. Cl.
CPC ........ *H01L 29/0673* (2013.01); *H01L 29/161* (2013.01); *H01L 29/41733* (2013.01); *H01L 29/42392* (2013.01); *H01L 29/66545* (2013.01); *H01L 29/66636* (2013.01); *H01L 29/66742* (2013.01); *H01L 29/78696* (2013.01)

(58) Field of Classification Search
CPC . H01L 29/775; H01L 29/7848; H01L 29/165; H01L 29/1033; H01L 29/78; H01L 29/785; H01L 21/823418; H01L 21/823437; H01L 21/823475; B82Y 10/00
See application file for complete search history.

(56) References Cited

U.S. PATENT DOCUMENTS

| | | | |
|---|---|---|---|
| 10,944,009 B2 * | 3/2021 | Wang | H01L 21/02603 |
| 2002/0028991 A1 * | 3/2002 | Thompson | A61B 5/282 |
| | | | 977/734 |
| 2009/0057654 A1 | 3/2009 | Saito et al. | |
| 2009/0184346 A1 | 7/2009 | Jain | |
| 2014/0291744 A1 | 10/2014 | Saito et al. | |
| 2018/0151733 A1 | 5/2018 | Glass et al. | |
| 2019/0067490 A1 * | 2/2019 | Yang | B82Y 10/00 |
| 2019/0081155 A1 * | 3/2019 | Xie | H01L 29/66553 |
| 2019/0097050 A1 * | 3/2019 | Ebrish | H01L 29/0847 |
| 2019/0157444 A1 * | 5/2019 | Yang | H01L 21/823431 |
| 2020/0044045 A1 | 2/2020 | Wang et al. | |
| 2020/0105753 A1 * | 4/2020 | Kotlyar | H01L 29/785 |
| 2020/0135932 A1 * | 4/2020 | Wang | H01L 29/41733 |
| 2021/0057570 A1 * | 2/2021 | Lin | H01L 29/0847 |
| 2021/0104616 A1 * | 4/2021 | Su | H01L 29/78696 |
| 2021/0126135 A1 * | 4/2021 | Lee | H01L 29/66742 |
| 2021/0375687 A1 * | 12/2021 | Lin | H01L 29/785 |
| 2022/0028991 A1 * | 1/2022 | More | H01L 29/7851 |
| 2022/0293760 A1 * | 9/2022 | Hung | H01L 27/088 |
| 2022/0359208 A1 * | 11/2022 | Lin | H01L 29/0665 |

* cited by examiner

SEMICONDUCTOR DEVICES

CROSS-REFERENCE TO RELATED APPLICATION

Korean Patent Application No. 10-2020-0109329, filed on Aug. 28, 2020, in the Korean Intellectual Property Office, and entitled: "Semiconductor Devices," is incorporated by reference herein in its entirety.

BACKGROUND

1. Field

Embodiments relate to a semiconductor device.

2. Description of the Related Art

As a demand for high performance, high speed, and/or multifunctionality of semiconductor devices, or the like, is increased, a degree of integration of semiconductor devices has also increased.

SUMMARY

The embodiments may be realized by providing a semiconductor device including an active region extending in a first direction on a substrate; a plurality of channel layers vertically spaced apart from each other on the active region; a gate structure extending in a second direction and intersecting the active region and the plurality of channel layers on the substrate, the gate structure surrounding the plurality of channel layers; a source/drain region on the active region on at least one side of the gate structure and in contact with the plurality of channel layers; and a contact plug connected to the source/drain region and extending in a vertical direction, wherein the source/drain region includes a first epitaxial layer on side surfaces of the plurality of channel layers and including a first impurity; a second epitaxial layer on the first epitaxial layer and including the first impurity and a second impurity; and a third epitaxial layer on the second epitaxial layer and including the first impurity, and in a horizontal sectional view of a plane at a height level of one of the plurality of channel layers, the second epitaxial layer includes a peripheral portion having a thickness measured in the first direction that increases along the second direction.

The embodiments may be realized by providing a semiconductor device including an active region extending in a first direction on a substrate; a plurality of channel layers vertically spaced apart from each other on the active region; a gate structure extending in a second direction and intersecting the active region and the plurality of channel layers on the substrate, the gate structure surrounding the plurality of channel layers; and a source/drain region on the active region on at least one side of the gate structure and in contact with the plurality of channel layers, wherein the source/drain region includes a first epitaxial layer in contact with side surfaces of the plurality of channel layers and the active region and including silicon-germanium (SiGe) and boron (B); and a second epitaxial layer on the first epitaxial layer and including silicon-germanium (SiGe), boron (B), and carbon (C), and the second epitaxial layer covers end portions of the first epitaxial layer in the second direction.

The embodiments may be realized by providing a semiconductor device including an active region extending in a first direction on a substrate; a gate structure extending in a second direction, perpendicular to the first direction, and intersecting the active region; and a source/drain region on a recessed region of the active region at both sides of the gate structure, the source/drain region including a plurality of epitaxial layers, wherein: the plurality of epitaxial layers of the source/drain region include a first epitaxial layer covering an inner wall of the recessed region of the active region; and a second epitaxial layer on the first epitaxial layer, in the recessed region of the active region, the first epitaxial layer and the second epitaxial layer include silicon-germanium (SiGe) having different compositions, each of the first epitaxial layer and the second epitaxial layer includes a first impurity including boron (B), the second epitaxial layer further includes a second impurity including carbon (C), and at least one of the first epitaxial layer and the second epitaxial layer includes different portions having different thicknesses in the first direction.

BRIEF DESCRIPTION OF DRAWINGS

Features will be apparent to those of skill in the art by describing in detail exemplary embodiments with reference to the attached drawings in which.

DETAILED DESCRIPTION

Figure 1:
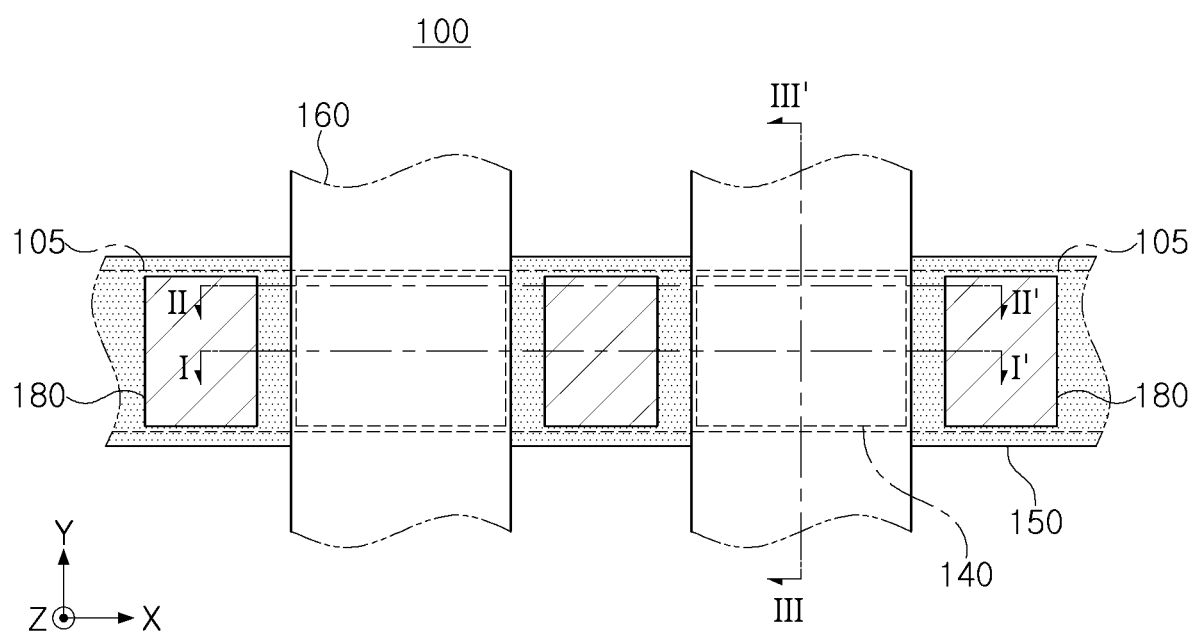
FIG. 1 is a plan view of a semiconductor device according to example embodiments.
Figure 2A:
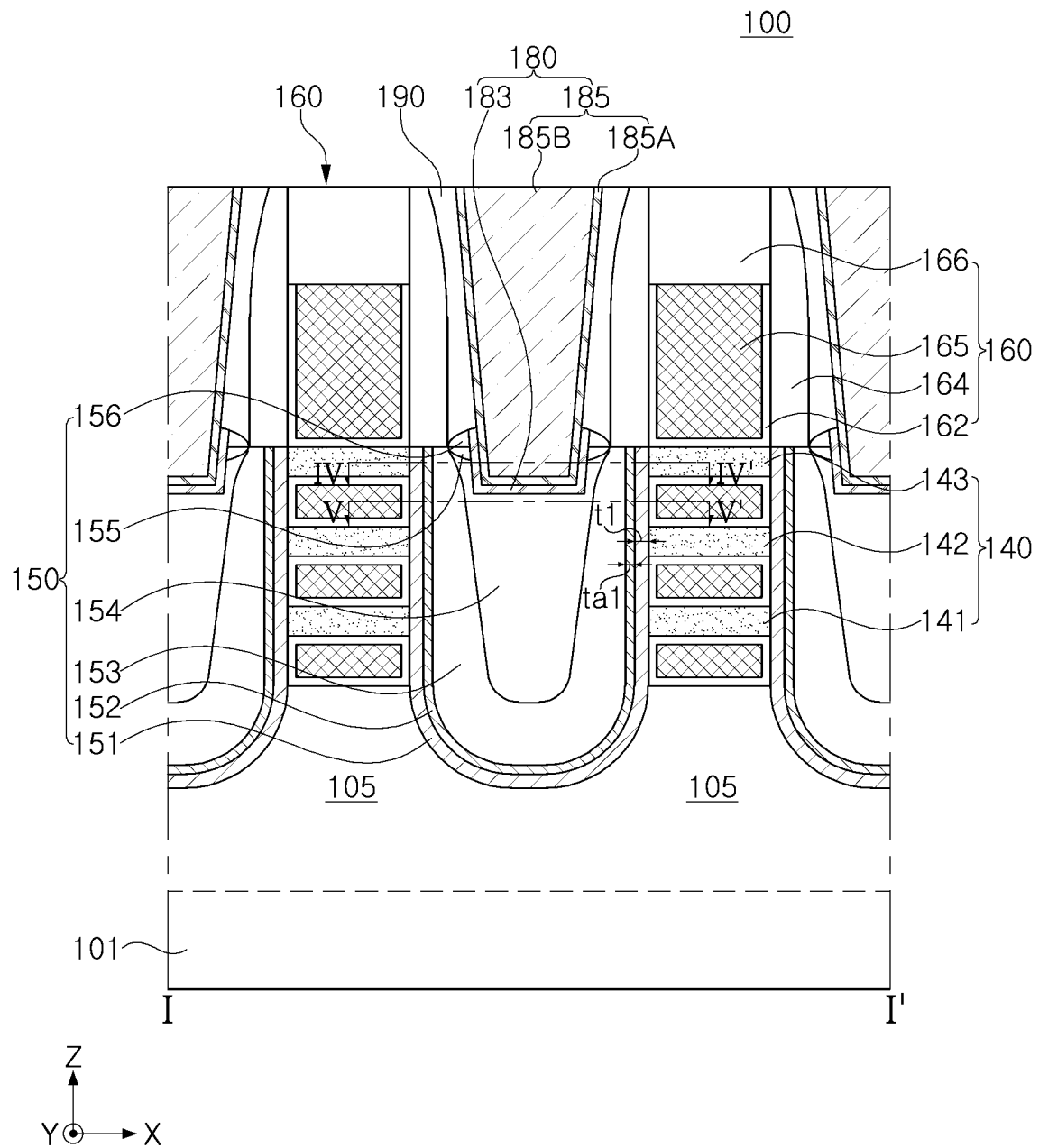
FIGS. 2A, 2B, and 2C are cross-sectional views of semiconductor devices according to example embodiments.
Figure 2B:
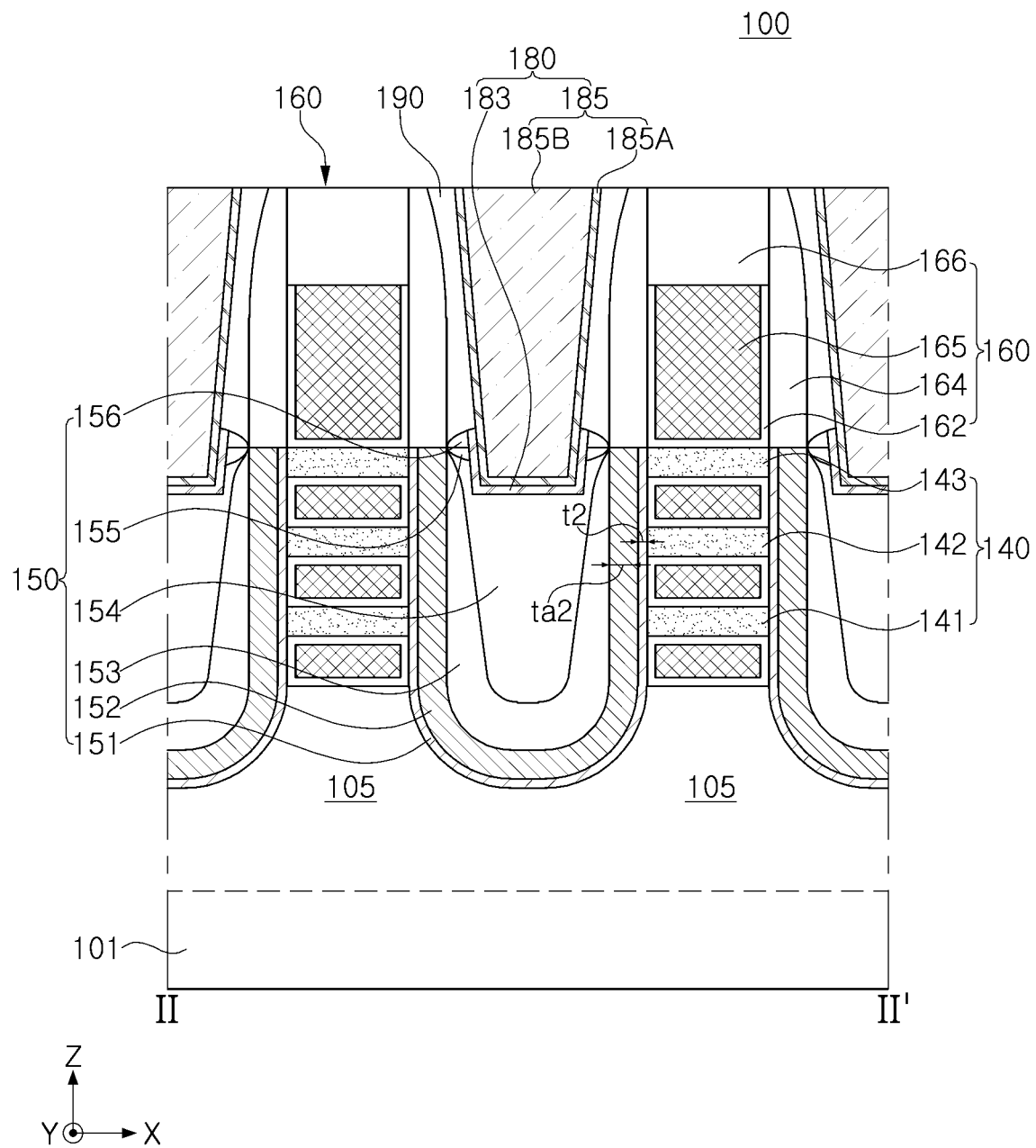
Figure 2C:
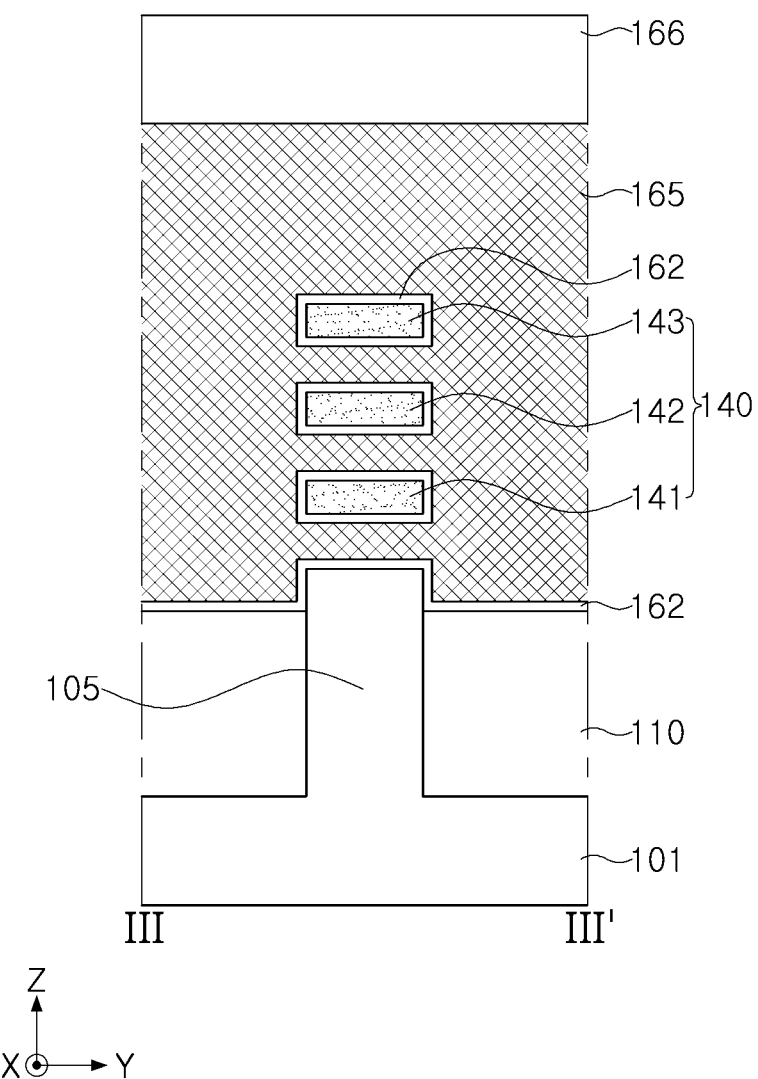
Figure 3A:
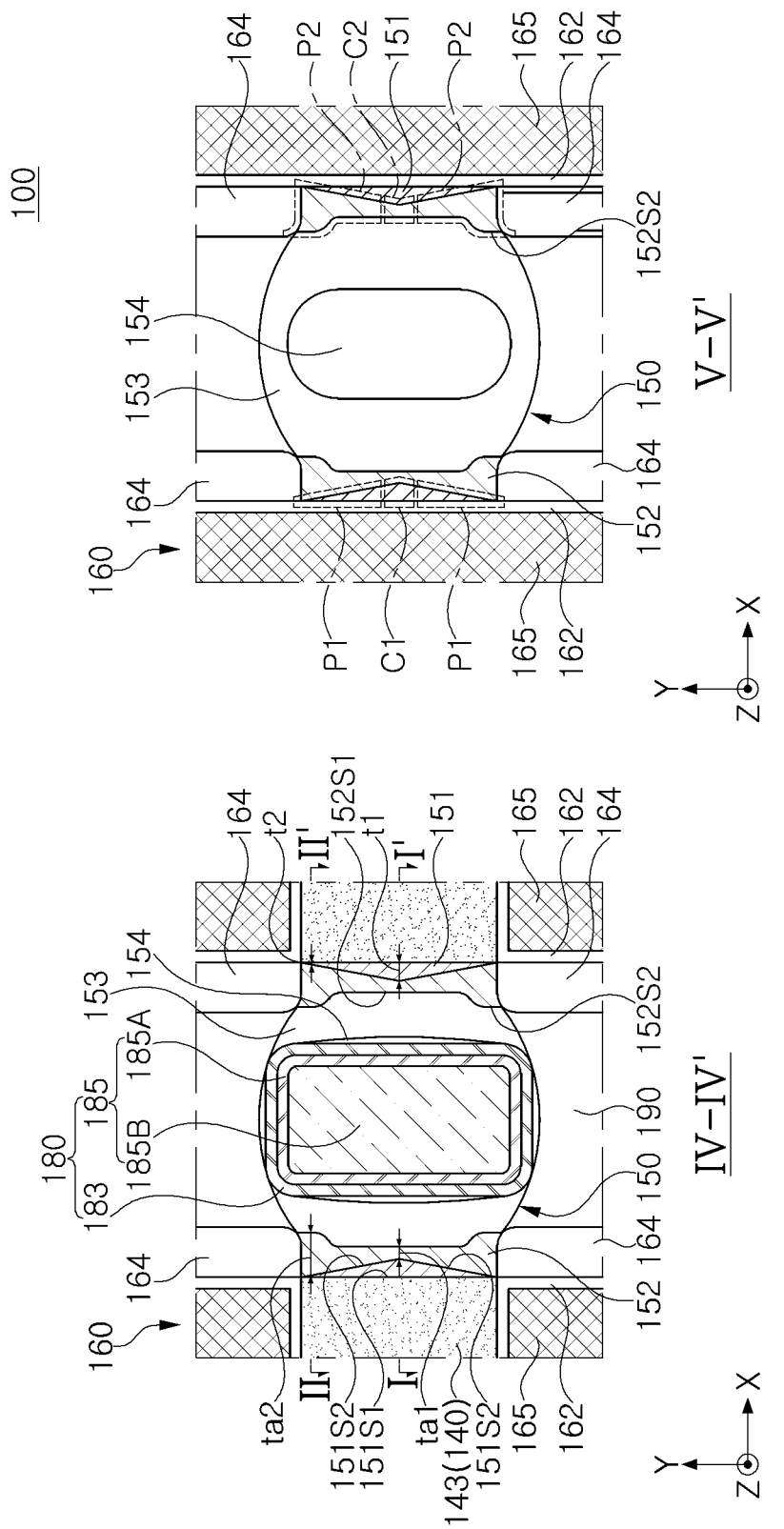
FIGS. 3A, 3B, 3C, and 3D are horizontal sectional views of semiconductor devices according to example embodiments.

FIG. 1 is a plan view of a semiconductor device according to example embodiments. FIGS. 2A, 2B, and 2C are cross-sectional views of a semiconductor device according to example embodiments, e.g., cross-sectional views of the semiconductor device of FIG. 1 taken along lines I-I', II-II', and III-III', respectively. FIG. 3A illustrates horizontal sectional views of a semiconductor device according to example embodiments, e.g., cross-sectional views of the semiconductor device of FIG. 2A taken along lines IV-IV' and V-V' (e.g., as viewed from above along the vertical Z direction).

A line IV-IV' is a line cutting the semiconductor device 100 along a horizontal surface (an X-Y plane) at a height level, corresponding to one of the channel layers 141, 142, and 143 of the semiconductor device 100, e.g., the third channel layer 143. A line V-V is a line cutting the semiconductor device 100 along a horizontal surface (an X-Y plane) at a height level, corresponding to a gate electrode 165 between the channel layers 141, 142, and 143 of the semiconductor device 100, e.g., a gate electrode 165 between the second and third channel layers 142 and 143. Hereinafter, the cutting surface of the semiconductor device 100 by the line IV-IV' will be referred to as a first horizontal sectional view, and the cutting surface of the semiconductor device 100 by the line V-V' will be referred to as a second horizontal sectional view.

The first and second horizontal sectional views may be understood as cross-sections obtained by cutting the semiconductor device 100 such that the source/drain region 150 are cut along a direction parallel to the upper surface of the substrate 101.

Referring to FIGS. 1 to 3A, the semiconductor device 100 may include a substrate 101, an active region 105 on the substrate 101, channel structures 140 (including a plurality of channel layers 141, 142, and 143 vertically spaced apart from each other) on the active region 105, source/drain regions 150 in contact with the plurality of channel layers 141, 142, and 143, gate structures 160 intersecting the active region 105, and contact structures 180 connected to the source/drain regions 150.

The semiconductor device 100 may further include device isolation layers 110 and an interlayer insulating layer 190. The gate structure 160 may include a gate dielectric layer 162, a gate electrode 165, spacer layers 164, and a gate capping layer 166.

In the semiconductor device 100, the active region 105 may have a fin structure, the gate electrode 165 may be between the active region 105 and the channel structure 140, between the plurality of channel layers 141, 142, and 143 of the channel structure 140, and above the channel structure 140. In an example embodiment, the semiconductor device 100 may include a transistor of a multi bridge channel FET (MBCFET™), which is a gate-all-around type field effect transistor, by the channel structures 140, the source/drain regions 150, and the gate structures 160. The transistor may be, e.g., a PMOS transistor.

The substrate 101 may have an upper surface extending in an X direction and a Y direction (e.g., in an X-Y plane). The substrate 101 may include a semiconductor material, e.g., a Group IV semiconductor, a Group III-V compound semiconductor, or a Group II-VI compound semiconductor. In an example embodiment, the Group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like. As used herein, the term "or" is not an exclusive term, e.g., "A or B" would include A, B, or A and B.

The device isolation layers 110 may define the active regions 105 in the substrate 101. The device isolation layer 110 may be formed by, e.g., a shallow trench isolation (STI) process. In an example embodiment, the device isolation layer 110 may further include a region extending deeper and having a step below the substrate 101. The device isolation layer 110 may partially expose an upper portion of the active region 105. In an example embodiment, the device isolation layer 110 may have a curved upper surface having a higher level as it is adjacent to the active region 105. The device isolation layer 110 may be made of an insulating material. The device isolation layer 110 may be, e.g., an oxide, a nitride, or a combination thereof.

The active region 105 may be defined by the device isolation layer 110 in the substrate 101, and may extend (e.g., lengthwise) in a first direction, e.g., a horizontal X direction. The active region 105 may have a structure protruding from the substrate 101. An upper end of the active region 105 may protrude from or above the upper surface of the device isolation layer 110 to a predetermined height. The active region 105 may be formed of a part of the substrate 101 or may include an epitaxial layer grown from the substrate 101. In an example embodiment, the active region 105 may be partially recessed on both sides of the gate structures 160, and the source/drain regions 150 may be on the recessed portion of the active region 105. The active region 105 may include impurities or doped regions including impurities.

The channel structure 140 may include first to third channel layers 141, 142, and 143, which are two or more plurality of channel layers, spaced apart from each other in a direction perpendicular to the upper surface of the active region 105, e.g., in the vertical Z direction, on the active region 105. The first to third channel layers 141, 142, and 143 may be connected to the source/drain regions 150 and spaced apart from the upper surface of the active region 105. The first to third channel layers 141, 142, and 143 may have the same or similar width as the active region 105 in a horizontal Y direction, and may have the same or similar width as the gate structure 160 in the X direction. In an example embodiment, the first to third channel layers 141, 142, and 143 may have a reduced width so that side surfaces are located below the gate structure 160 in the x direction.

The first to third channel layers 141, 142, and 143 may be formed of a semiconductor material, and may include, e.g., silicon (Si), silicon germanium (SiGe), or germanium (Ge). In an example embodiment, the first to third channel layers 141, 142, and 143 may be formed of the same material as the substrate 101. In an example embodiment, the first to third channel layers 141, 142, and 143 may include an impurity region positioned in a region, adjacent to the source/drain region 150. The number and shape of the channel layers 141, 142, and 143 constituting one channel structure 140 may be variously changed in example embodiments. In an example embodiment, the channel structure 140 may further include a channel layer on the upper surface of the active region 105.

Source/drain regions 150 may be on the active regions 105, respectively, on both sides of the channel structure 140. The source/drain regions 150 may include a first epitaxial layer 151, a second epitaxial layer 152, a third epitaxial layer 153, a fourth epitaxial layer 154, a fifth epitaxial layer 155, and a sixth epitaxial layer 156, which are sequentially disposed on recessed portions of the active region 105. The first to sixth epitaxial layers 151, 152, 153, 154, 154, 155, and 156 may be semiconductor layers including silicon (Si) or silicon-germanium (SiGe), and may include impurities having different types or concentrations.

The first epitaxial layer 151 may be on a side surface of each of the first to third channel layers 141, 142, and 143 of the channel structure 140. The first epitaxial layer 151 may be on side surfaces of the gate electrode 165 between the first to third channel layers 141, 142, and 143. The first epitaxial layer 151 may contact the first to third channel layers 141, 142 and 143 of the channel structure 140, and may contact a gate dielectric layer 162 at a height level between the first to third channel layers 141, 142 and 143. The first epitaxial layer 151 may extend (e.g., lengthwise) in a Z direction along the side surface of each of the first to third channel layers 141, 142 and 143 of the channel structure 140, as shown in FIG. 2A, and a lower end thereof may be in contact (e.g., direct contact) with the active region 105 of the substrate 101.

The first epitaxial layer 151 may include a first impurity and silicon-germanium. The first impurity may include a p-type impurity, e.g., boron (B). A germanium concentration of the first epitaxial layer 151 may be smaller than a germanium concentration of the second epitaxial layer 152. A concentration of the p-type impurity in the first epitaxial layer 151 may be smaller than a concentration of the p-type impurity in the second epitaxial layer 152.

As shown in FIG. 3A, in the first horizontal sectional view, the first epitaxial layer 151 may extend in the Y direction while in contact with the third channel layer 143 of the channel structure 140. In the second horizontal sectional view, the first epitaxial layer 151 may extend in the Y direction along the side surface of the gate electrode 165. In the first and second horizontal sectional views, the first epitaxial layer 151 may include a first central portion C1 having a first thickness t1, which is a maximum thickness in the X direction, and a first peripheral portion P1 whose thickness in the X direction decreases toward an end portion, e.g., along the Y direction. The first peripheral portion P1 of the first epitaxial layer 151 may have a second thickness t2, smaller than the first thickness t1, as measured in the X direction.

As shown in FIG. 3A, in the first and second horizontal sectional views, the first epitaxial layer 151 may have a first surface 151S1, in contact (e.g., direct contact) with the third channel layer 143 and the gate dielectric layer 162 and second surfaces 151S2 in contact (e.g., direct contact) with the epitaxial layer 152. The first surface 151S1 may be substantially flat. The second surfaces 151S2 may form an acute angle with the first surface 151S1 (e.g., where the second surfaces 151S2 meet the first surface 151S1). The second surfaces 151S2 may meet each other so that the first epitaxial layer 151 has the first thickness t1 that is the maximum thickness in the first central portion C1.

In the first and second horizontal sectional views, the first and second surfaces 151S1 and 151S2 of the first epitaxial layer 151 may form a triangular shape or a similar shape. In an example embodiment, in the first and second horizontal sectional views of the semiconductor device, the second surfaces 151S2 may be curved surfaces that are convex outwardly of the first epitaxial layer 151.

The first epitaxial layer 151 may help reduce lattice mismatch between the second epitaxial layer 152 and the active region 105 made of silicon, and may reduce lattice defects in the source/drain regions 150. The first epitaxial layer 151 may be on both sides of the channel structure 140 along or relative to the X direction. The first epitaxial layer 151 may be on both sides of the channel structure 140, and a short channel effect caused by diffusion of impurities in the source/drain regions 150 may be effectively suppressed.

The second epitaxial layer 152 may be on the first epitaxial layer 151. The second epitaxial layer 152 may be on (e.g., inner) side surfaces of the first epitaxial layer 151, e.g., on the second surfaces 151S2. The second epitaxial layer 152 may contact the second surfaces 151S2 of the first epitaxial layer 151. As shown in FIG. 2A, the second epitaxial layer 152 may extend in the Z direction along the second surfaces 151S2 of the first epitaxial layer 151, and may be disposed such that a lower end thereof is in contact with a lower portion of the first epitaxial layer 151. The second epitaxial layer 152 may cover end portions of the first epitaxial layer 151 along the Y direction, and a second peripheral portion P2 of the second epitaxial layer 152 may also directly cover a portion of side surfaces of the channel structure 140.

The second epitaxial layer 152 may include the first impurity, the second impurity, and silicon-germanium. The first impurity may be a common impurity included in the first epitaxial layer 151 and the second epitaxial layer 152. The second impurity may include an element different from the first impurity. The second impurity may include, e.g., carbon (C). The second epitaxial layer 152 may contain carbon, e.g., at a concentration of about 0.5 atomic % to about 4 atomic %. When the second epitaxial layer 152 contains carbon in an amount of about 0.5 atomic % or greater, an effect of preventing diffusion of impurities and germanium elements described below may be sufficient. When the second epitaxial layer 152 contains carbon in an amount of about 4 atomic % or less, resistance of the source/drain regions 150 may be maintained.

Carbon included in the second epitaxial layer 152 may be diffused in a small amount into some regions of adjacent epitaxial layers, e.g., the first epitaxial layer 151 may also include a small amount of carbon diffused from the second epitaxial layer 152, but the concentration thereof may be less than the concentration of the second epitaxial layer 152. In an example embodiment, the epitaxial layers adjacent to the second epitaxial layer 152 may not contain carbon.

The second epitaxial layer 152 may include germanium in a concentration of, e.g., about 15 atomic % to about 40 atomic %. The second epitaxial layer 152 may contain boron in a concentration of 0.5 atomic % to about 4 atomic %. The germanium concentration of the second epitaxial layer 152 may be less than the germanium concentration of the third epitaxial layer 153. A concentration of the p-type impurity in the second epitaxial layer 152 may be smaller than a concentration of the p-type impurity in the third epitaxial layer 153.

As shown in FIG. 3A, in the first and second horizontal sectional views, the second epitaxial layer 152 may extend in the Y direction. In the first and second horizontal sectional views, the second epitaxial layer 152 may include a second central portion C2 having a first thickness ta1 that is a minimum thickness (as measured in the X direction) and a second peripheral portion P2 whose thickness in the X direction increases toward an end portion along the Y direction. The second peripheral portion P2 of the second epitaxial layer 152 may have a second thickness ta2, greater than the first thickness ta1, as measured in the X direction. The second peripheral portion P2 may contact (e.g., directly contact) spacer layers 164. The second thickness ta2 may be about 1 to about 2 times the first thickness ta1. When the second thickness ta2 is about 1 times the first thickness ta1, the first thickness ta1 and the second thickness ta2 are the same, e.g., it may correspond to the example embodiment of FIG. 3D, described below.

As shown in FIG. 3A, in the first and second horizontal sectional views, a surface of the second epitaxial layer 152 in contact with the first epitaxial layer 151 may have a shape corresponding or complementary to second surfaces 151S2 of the first epitaxial layer 151. In the first and second horizontal sectional views, the second epitaxial layer 152 may have a first surface 152S1 that is substantially flat and a second surface 152S2 that is convex outwardly from the second peripheral portion P2. The second surface 152S2 may be bent from the first surface 152S1 to be convex along a direction away from the gate structure 160. In the first and second horizontal sectional views, one surface of the second epitaxial layer 152 in contact with the third epitaxial layer 153 may include a portion concave inwardly toward the first epitaxial layer 151.

As shown in FIG. 3A, in the first and second horizontal sectional views, the second epitaxial layer 152 may cover the first peripheral portion P1 of the first epitaxial layer 151. The second epitaxial layer 152 may cover the first peripheral portion P1 of the first epitaxial layer 151 in the X direction and end portions along the Y direction of the first epitaxial layer 151.

The second epitaxial layer 152 may also help reduce lattice defects in the source/drain regions 150 together with the first epitaxial layer 151. The second epitaxial layer 152 may also be on both sides of the channel structure 140, and a short channel effect caused by diffusion of impurities in the source/drain regions 150 may be effectively suppressed.

The first peripheral portion P1 or end portions of the first epitaxial layer 151 may be portions into which an etchant for removing sacrificial layers 120 (see FIGS. 13A and 14C) may easily penetrate into the source/drain regions 150. By disposing the second epitaxial layer 152 to cover the first peripheral portion P1 or end portion of the first epitaxial layer 151 with a relatively thick thickness, it is possible to help prevent the source/drain regions 150 from being damaged by the etchant flowing into the source/drain regions 150 through the first peripheral portion P1 or end portions of the first epitaxial layer 151. In addition, the second epitaxial layer 152 doped with carbon may help prevent diffusion of a germanium element from the third to fifth epitaxial layers 153, 154, and 155 containing high concentration germanium to the first epitaxial layer 151. By increasing etching selectivity between the sacrificial layers 120 (see FIG. 12A) and the first epitaxial layer 151 containing germanium by preventing diffusion of a germanium element, the first epitaxial layer 151 may serve as a protective layer during a process of removing the sacrificial layers 120 to help prevent damage to the source/drain regions 150. Accordingly, a semiconductor device having improved reliability and electrical characteristics can be provided.

The second epitaxial layer 152 may help suppress the diffusion of germanium elements and impurities, a volume of epitaxial layers including a relatively high concentration of impurities and a high concentration of germanium elements in the source/drain regions 150 may increase, and the electrical characteristics of the semiconductor device 100 may be further improved.

A total thickness of the first epitaxial layer 151 and the second epitaxial layer 152 in the X direction may range from about 2 nm to about 5 nm. In a specific cutting surface, e.g., FIG. 2A, the thickness t1 of the first epitaxial layer 151 in the X direction may be greater than the thickness ta1 of the second epitaxial layer 152 in the X direction. In a specific cut surface, e.g., in FIG. 2B, the thickness t2 of the first epitaxial layer 151 in the X direction may be smaller than the thickness ta2 of the second epitaxial layer 152 in the X direction. The second epitaxial layer 152 may have a thickness ranging from about 35% to about 100% of the total thickness (e.g., of the first epitaxial layer 151 and the second epitaxial layer 152). When the second epitaxial layer 152 has a thickness corresponding to about 100% of the total thickness, the first epitaxial layer 151 may be omitted, e.g., it may correspond to the example embodiment in FIG. 5A and FIG. 5B.

A sum of the second thickness t2 of the first epitaxial layer 151 and the second thickness ta2 of the second epitaxial layer 152 may be greater than a sum of the first thickness t1 of the first epitaxial layer 151 and the first thickness ta1 of and the second epitaxial layer 152. The second thickness ta2 of the second epitaxial layer 152 may be greater than the second thickness t2 of the first epitaxial layer 151. The first thickness ta1 of the second epitaxial layer 152 may be smaller than the first thickness t1 of the first epitaxial layer 151.

The third to sixth epitaxial layers 153, 154, 155 and 156 may be on the first and second surfaces 151S1 and 152S2 of the second epitaxial layer 152. The third epitaxial layer 153 may contact the first and second surfaces 151S1 and 152S2 of the second epitaxial layer 152. The third epitaxial layer 153 may extend in the Z direction along the first and second surfaces 151S1 and 151S2 of the second epitaxial layer 152, and may be disposed such that a lower end thereof contacts a lower portion of the second epitaxial layer 152. The fourth epitaxial layer 154 may fill a space between inner side surfaces of the third epitaxial layer 153. The fifth epitaxial layer 155 may cover an upper surface of the fourth epitaxial layer 154. The sixth epitaxial layer 156 may cover an upper surface of the fifth epitaxial layer 155. An upper end of the fifth epitaxial layer 155 may be positioned at substantially the same height level (e.g., distance from the substrate 101 in the Z direction) as an upper end of the uppermost third channel layer 143, or may be positioned thereabove. An upper end of the sixth epitaxial layer 156 may be positioned at a height level higher than that of the uppermost third channel layer 145.

The third to sixth epitaxial layers 153, 154, 155, and 156 may include the first impurity and silicon-germanium. The first impurity may include a p-type impurity, e.g., boron (B). The first impurity may be a common impurity included in the first to sixth epitaxial layers 151, 152, 153, 154, 155, and 156. The germanium concentration of the third to sixth epitaxial layers 153, 154, 155, and 156 may vary according to example embodiments. In an example embodiment, at least a portion of the third to sixth epitaxial layers 153, 154, 155, and 156 may be omitted.

The gate structure 160 may extend (e.g., lengthwise) in one direction, e.g., a Y direction, intersecting the active region 105 and the channel structure 140 above the active region 105 and the channel structures 140. A channel region of transistors may be formed in the active regions 105 and the channel structures 140, intersecting the gate structure 160. The gate structure 160 may include a gate electrode 165, a gate dielectric layer 162 between the gate electrode 165 and the plurality of channel layers 141, 142, and 143, spacer layers 164 on side surfaces of the gate electrode 165, and a gate capping layer 166 on an upper surface of the gate electrode 165.

The gate dielectric layer 162 may be between the active region 105 and the gate electrode 165, and between the channel structure 140 and the gate electrode 165, and may cover at least a portion of a surface of the gate electrode 165. In an example embodiment, the gate dielectric layer 162 may surround all surfaces of the gate electrode 165 except for an uppermost surface thereof. The gate dielectric layer 162 may extend between the gate electrode 165 and the spacer layers 164. The gate dielectric layer 162 may include an oxide, a nitride, or a high dielectric constant (high-k) material. The high-k material may mean a dielectric material having a dielectric constant, higher than that of silicon oxide ($SiO_2$). The high-k material may include, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfS_{ix}O_y$), lanthanum oxide ($L_{a2}O_3$), lanthanum aluminum oxide ($LaA_{1x}O_y$), lanthanum hafnium oxide ($LaH_{fx}O_y$), hafnium aluminum oxide ($HfA_{1x}O_y$), or praseodymium oxide ($Pr_2O_3$).

The gate electrode 165 may extend above the channel structure 140 on the active region 105 to fill a space between the plurality of channel layers 141, 142, and 143. The gate electrode 165 may be spaced apart from the plurality of channel layers 141, 142, and 143 by the gate dielectric layer 162. The gate electrode 165 may include a conductive material, e.g., a metal nitride such as a titanium nitride (TiN), a tantalum nitride (TaN), or a tungsten nitride (WN), or a metal material such as aluminum (Al), tungsten (W), molybdenum (Mo), or the like, or a semiconductor material such as doped polysilicon. The gate electrodes 165 may be formed of two or more multilayer structures. The gate electrode 165 may be disposed, isolated by a separate isolation portion between at least a portion of adjacent transistors, depending on the configuration of the semiconductor device 100.

The spacer layers 164 may be on both sides of the gate electrode 165. The spacer layers 164 may insulate the source/drain regions 150 and the gate electrodes 165 from each other. The spacer layers 164 may be formed of a multilayer structure according to example embodiments. The spacer layers 164 may be comprised of oxides, nitrides, or oxynitrides, e.g., low dielectric constant films. The gate capping layer 166 may be above the gate electrode 165, and lower surfaces and side surfaces thereof may be surrounded by the gate electrode 165 and the spacer layers 164, respectively.

As shown in FIG. 1, the contact structure 180 may be on the source/drain region 150, e.g., the contact structure 180 may have a longer length in the Y direction than the source/drain region 150 or the source/drain region 150 may have a longer length in the Y direction than the contact structure 180. The contact structure 180 may include a metal-semiconductor compound layer 183 and a contact plug 185. The metal-semiconductor compound layer 183 may be in or on the source/drain regions 150. The metal-semiconductor compound layer 183 may cover a portion of a side surface and a bottom surface of the contact plug 185. The contact plug 185 may be on the metal-semiconductor compound layer 183. The contact plug 185 may include a first conductive layer 185A and a second conductive layer 185B. The first conductive layer 185A may cover a lower surface and a side surface of the second conductive layer 185B.

The metal-semiconductor compound layer 183 may be a metal-silicon alloy layer, a metal-germanium alloy layer, or a metal-silicon-germanium alloy layer. In an example embodiment, the metal in the metal-semiconductor compound layer 183 may be titanium (Ti), tantalum (Ta), nickel (Ni), or cobalt (Co). The first conductive layer 185A may include a metal nitride, e.g., a titanium nitride (TiN), a tantalum nitride (TaN), or a tungsten nitride (WN). The second conductive layer 185B may include a metal material, e.g., aluminum (Al), tungsten (W), or molybdenum (Mo).

The contact plug 185 may penetrate through an interlayer insulating layer 190 to be connected to the source/drain regions 150, and apply an electric signal to the source/drain regions 150. The contact plug 185 may have an inclined side surface in which the width of the lower portion becomes narrower than the width of the upper portion according to an aspect ratio. The contact plug 185 may extend in the Z direction. The contact plug 185 may extend from above, e.g., may extend below the third channel layer 143. The depth at which the contact plug 185 recesses the source/drain region 150 may be variously changed according to example embodiments. In an example embodiment, the contact plug 185 may contact (e.g., directly contact) the source/drain region 150 along the upper surface of the source/drain region 150 without recessing the source/drain region 150.

Depending on the depth at which the contact plug 185 of the contact structure 180 recesses the source/drain region 150, a cross-section of the contact structure 180 may be seen in the first horizontal sectional view and the second horizontal sectional view, and may not be seen. In an example embodiment, a cross-section of the contact structure 180 may be seen in the first horizontal sectional view IV-IV' of FIG. 3A, and the cross-section of the contact structure 180 may not be seen in the second horizontal sectional view V-V of FIG. 3A. In the first horizontal sectional view and the second horizontal sectional view of example embodiments, the cross-section of the contact structure 180 may be all or may not be seen.

The interlayer insulating layer 190 may cover the source/drain regions 150 and the gate structures 160, and may cover the device isolation layer 110 in a region not shown. The interlayer insulating layer 190 may include, e.g., an oxide, a nitride, or an oxynitride, and may include a low dielectric constant material.

Figure 3B:
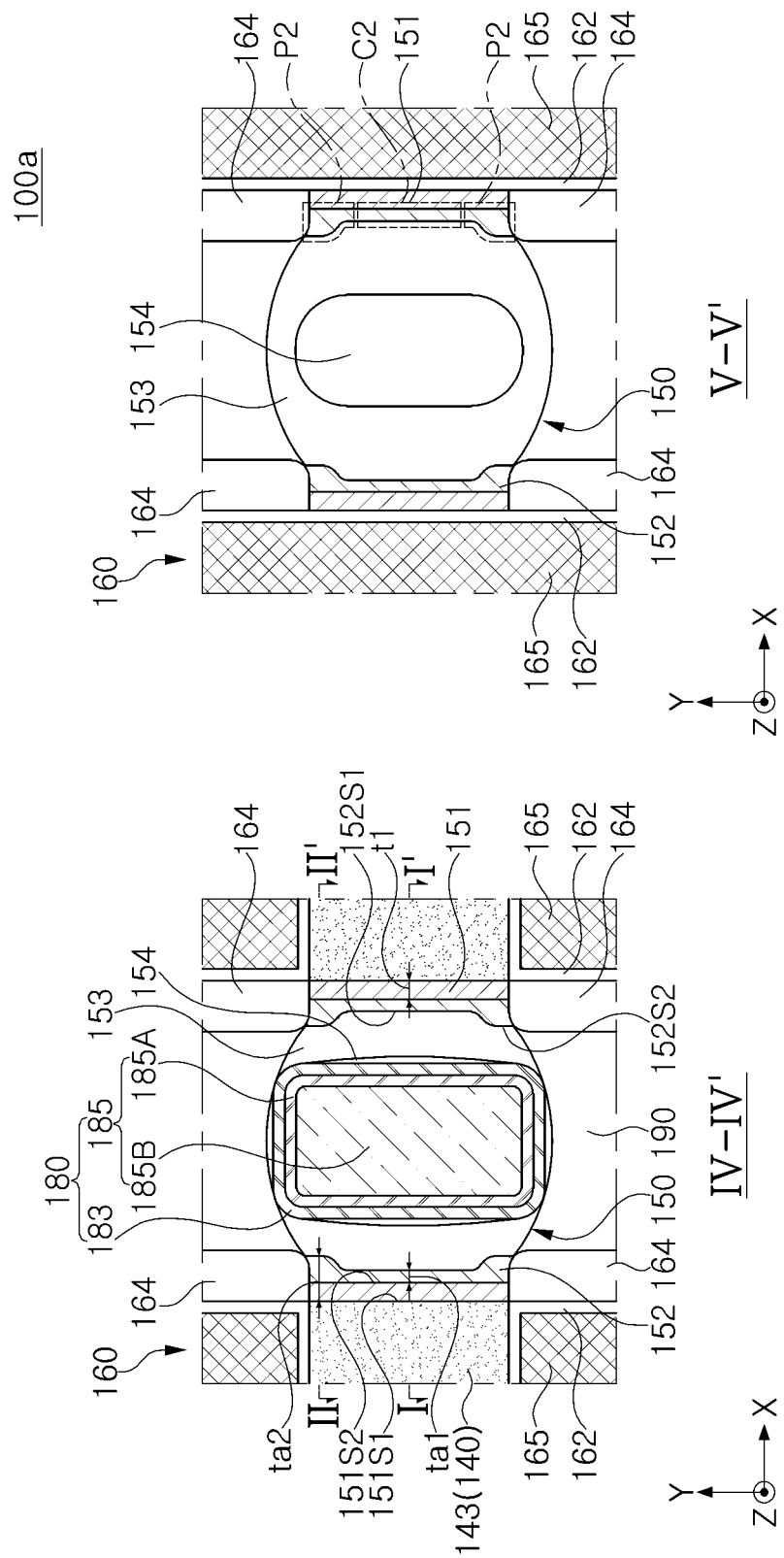

FIG. 3B is a horizontal sectional view of a semiconductor device according to example embodiments. FIG. 3B shows cross-sections corresponding to FIG. 3A.

Referring to FIG. 3B, in the semiconductor device 100a, a first surface 151S1 and a second surface 151S2 of the first epitaxial layer 151 may be substantially flat in first and second horizontal sectional views.

In the first and second horizontal sectional views, one surface of the second epitaxial layer 152 in contact with the first epitaxial layer 151 may also be substantially flat. In the first and second horizontal sectional views, the second epitaxial layer 152 may have a first surface 152S1, which is substantially flat and a second surface 152S2 that is convex outwardly from the second peripheral portion P2. The second surface 152S2 may be bent from the first surface 151S1 to be convex along a direction away from the gate structure 160. The second central portion C2 of the second epitaxial layer 152 may be longer along the Y direction than in the example embodiment of FIG. 3A. In an example embodiment, as described above in the example embodiments of FIGS. 2A to 3A, the second epitaxial layer 152 may help prevent damage to the source/drain regions 150.

Figure 3C:
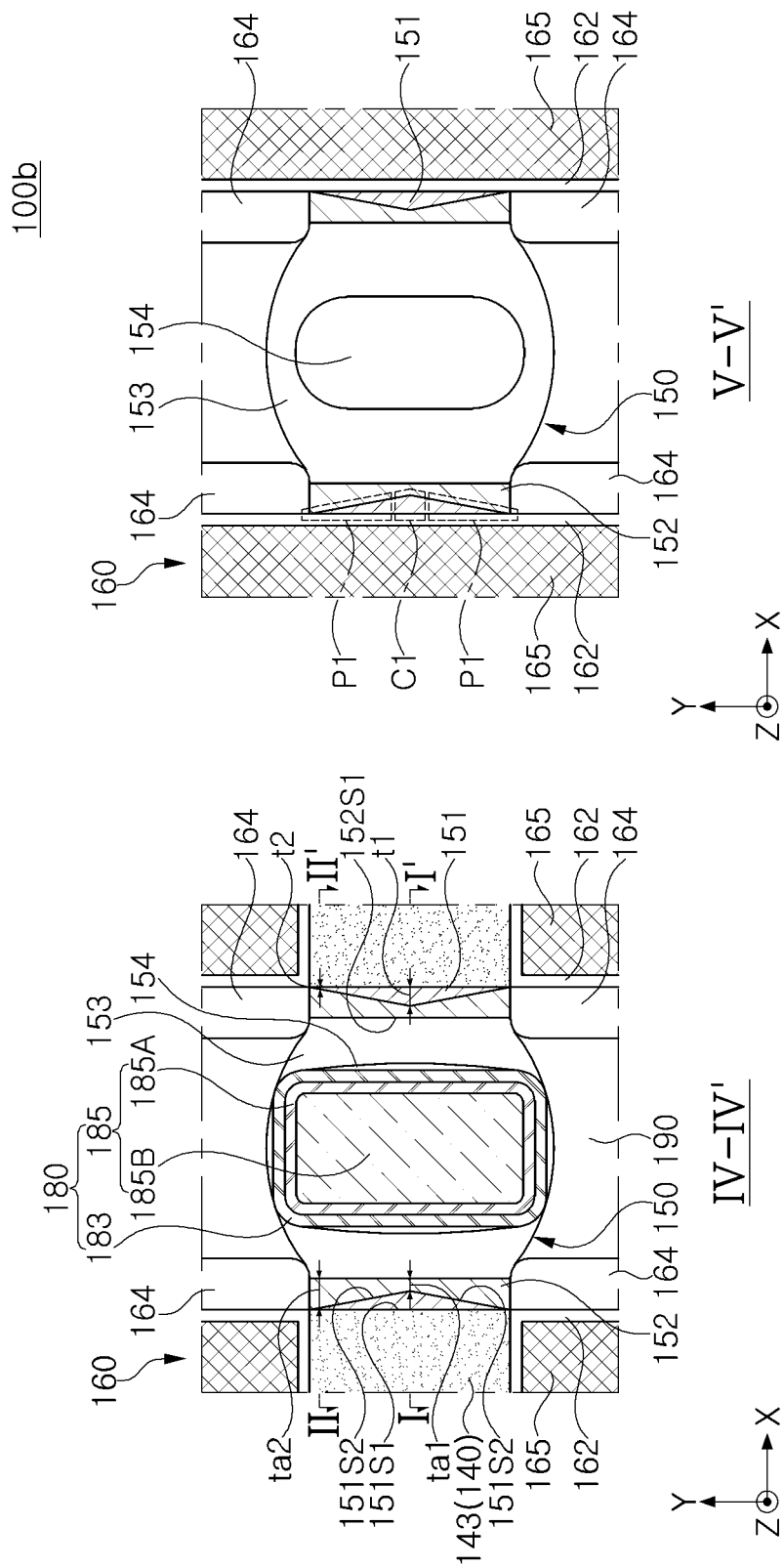

FIG. 3C is a horizontal sectional view of a semiconductor device according to example embodiments. FIG. 3C shows cross-sections corresponding to FIG. 3A.

Referring to FIG. 3C, in the semiconductor device 100b, a structure of the first epitaxial layer 151 may be the same as that of the example embodiment of FIG. 3A, and a structure of the second epitaxial layer 152 may be different from that of the example embodiment of FIG. 3A. In the first and second horizontal sectional views, one surface of the second epitaxial layer 152, in contact with the third epitaxial layer 153, may be substantially flat. Even in this case, the first peripheral portion P1 of the first epitaxial layer 151 may have a second thickness t2, smaller than the first thickness t1 of the first central portion C1, and the second peripheral portion P2 of the second epitaxial layer 152 may have a second thickness ta2, greater than the first thickness ta1 of the second central portion C2. Also in the present example embodiment, as described above in the example embodiments of FIGS. 2A to 3A, the second epitaxial layer 152 may help prevent damage to the source/drain regions 150.

Figure 3D:
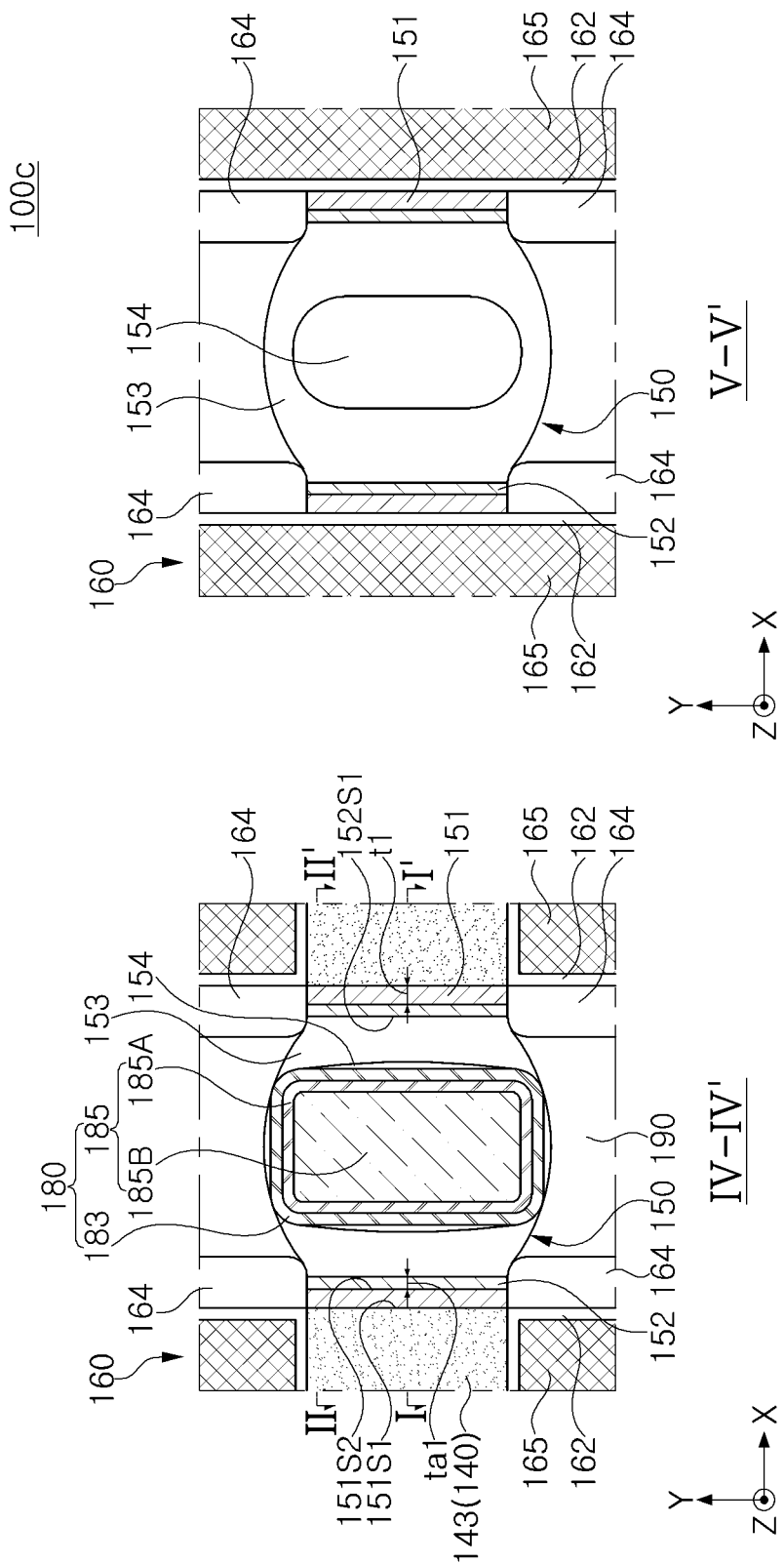

FIG. 3D is a horizontal sectional view of a semiconductor device according to example embodiments. FIG. 3D shows cross-sections corresponding to FIG. 3A.

Referring to FIG. 3D, in the semiconductor device 100c, a structure of the first epitaxial layer 151 may be the same as that of FIG. 3B, and a structure of the second epitaxial layer 152 may be different from that of the example embodiment of FIG. 3B. In the first and second horizontal sectional views, one surface of the second epitaxial layer 152 in contact with the third epitaxial layer 153 may be substantially flat. Side surfaces of the first epitaxial layer in the X direction and side surfaces of the second epitaxial layer 152 in the X direction may be substantially flat. In the first and second horizontal sectional views, a thickness of the second epitaxial layer 152 in the X direction may be in a range from about 35% to about 100% of the total thickness of the first and second epitaxial layers 151 and 152.

Figure 4:
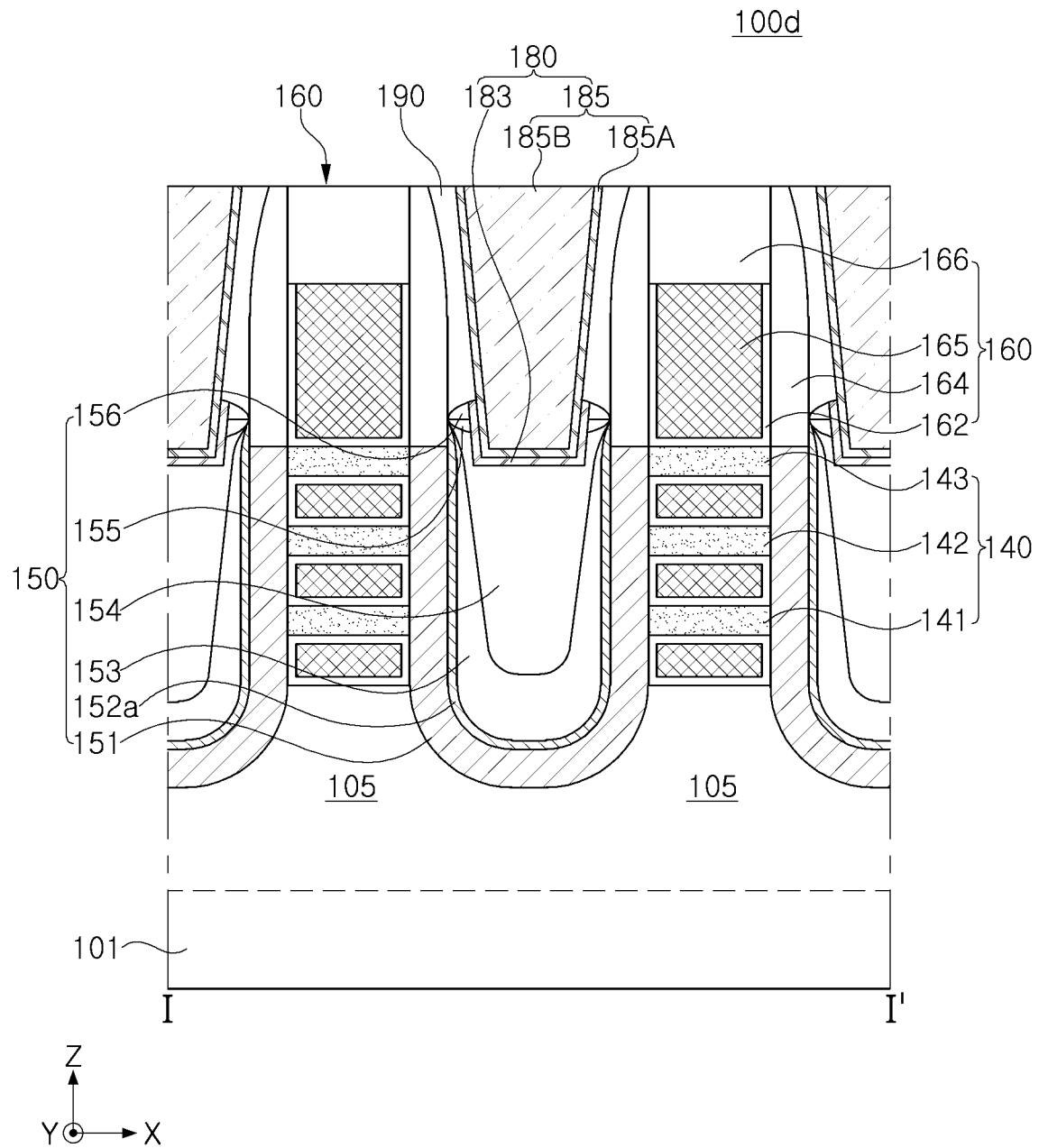
FIG. 4 is a cross-sectional view of a semiconductor device according to example embodiments.

FIG. 4 is a cross-sectional view of a semiconductor device according to example embodiments. FIG. 4 shows a cross section corresponding to FIG. 2A.

Referring to FIG. 4, in the semiconductor device 100d, an upper end of the second epitaxial layer 152a may be positioned at a height level higher (e.g., farther from the substrate 101 in the Z direction) than an upper end of the first epitaxial layer 151. An inner surface of the upper portion of the second epitaxial layer 152a may be bent toward the gate structure 160. Upper ends of the third to sixth epitaxial layers 153, 154, 155 and 156 may also be located at a height level higher than the upper end of the first epitaxial layer 151. Due to this structure, the second epitaxial layer 152a may help effectively suppress diffusion of impurities and/or germanium elements from the third to sixth epitaxial layers 153, 154, 155, and 156 toward the first epitaxial layer 151. Therefore, diffusion of impurities into the channel structure 140 may be prevented, and the source/drain regions 150 may be prevented from being damaged during the process of removing the sacrificial layers 120 (see FIGS. 13A and 14C), such that a semiconductor device having improved reliability and electrical characteristics may be provided.

Figure 5A:
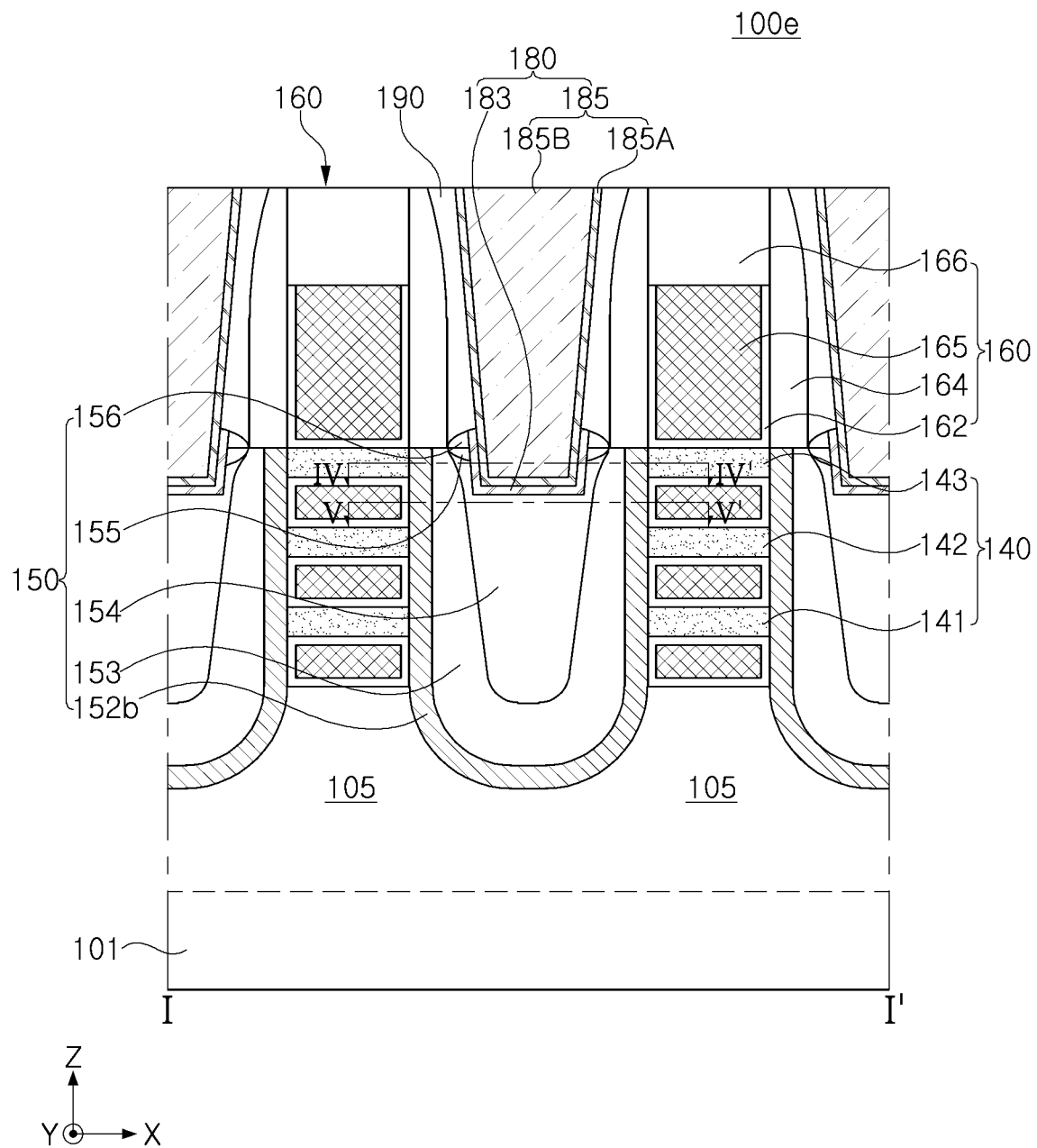
FIG. 5A is a cross-sectional view of a semiconductor device according to example embodiments.
Figure 5B:
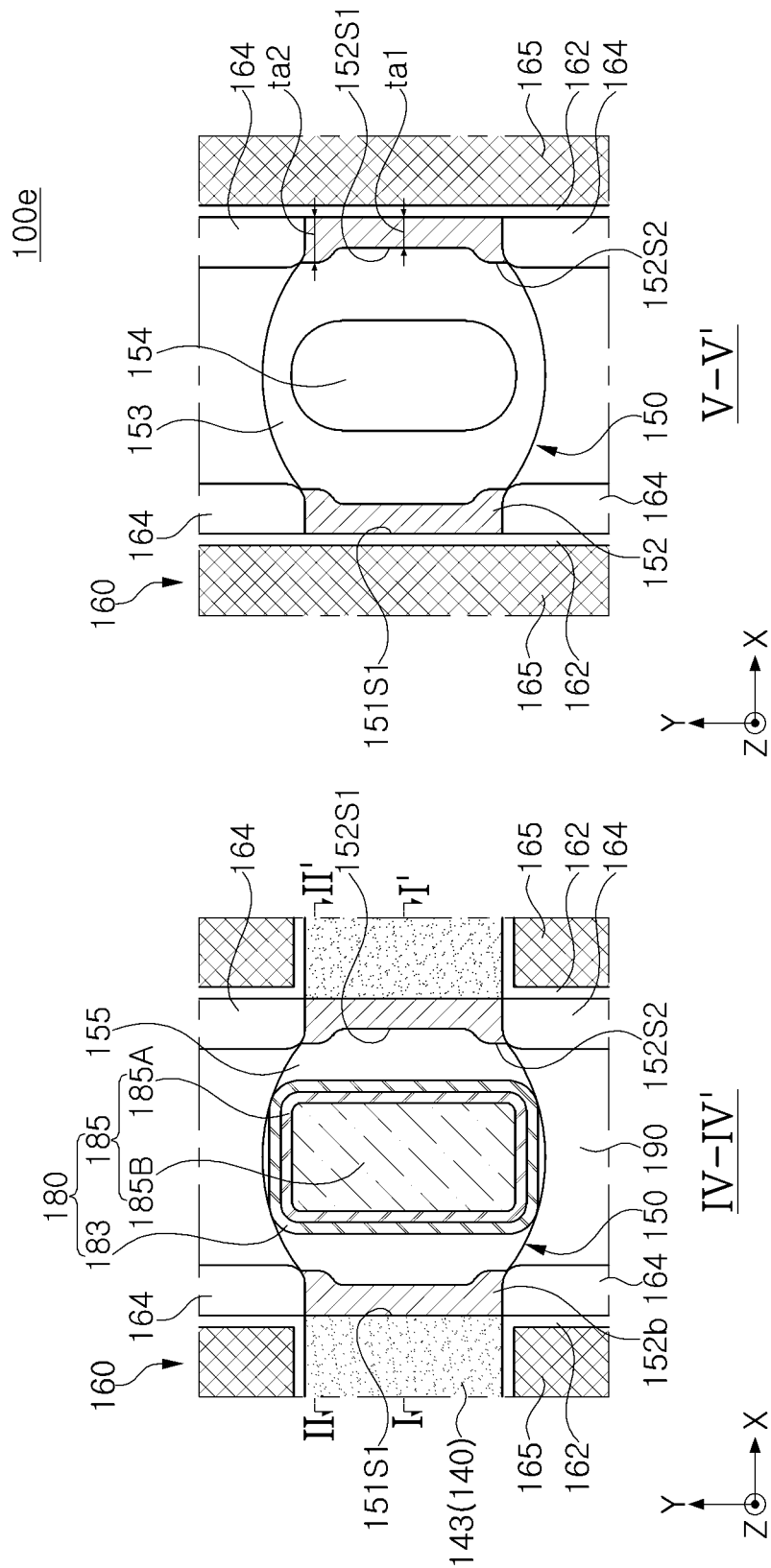
FIG. 5B is a horizontal sectional view of a semiconductor device according to example embodiments.

FIG. 5A is a cross-sectional view of a semiconductor device according to example embodiments. FIG. 5A shows a cross-section corresponding to FIG. 2A. FIG. 5B is a horizontally cut cross-sectional view of a semiconductor device according to example embodiments. 5B shows cross-sections corresponding to FIG. 3A.

Referring to FIGS. 5A and 5B, in the semiconductor device 100e, the first epitaxial layer 151 may be omitted, and the second epitaxial layer 152b doped with boron (B) and carbon (C) may contact (e.g., directly contact) a side surface of each of plurality of channel layers 141, 142, and 143 of the channel structure 140. The second epitaxial layer 152b may be on side surfaces of the gate electrode 165 between the first to third channel layers 141, 142, and 143. The second epitaxial layer 152b may contact a gate dielectric layer 162 at a height level between the first to third channel layers 141, 142, and 143.

The second epitaxial layer 152b may extend in the Z direction along a side surface of each of the first to third channel layers 141, 142, 143 of the channel structure 140, and may be disposed such that a lower end thereof contacts the active region 105 of the substrate 101. As shown in FIG. 5B, the second epitaxial layer 152b may include a second peripheral portion P2 whose thickness in the X direction increases toward an end portion along the Y direction, and may help prevent damage to the source/drain region 150 due to inflow of an etchant, when the sacrificial layers 120 are removed.

Figure 6:
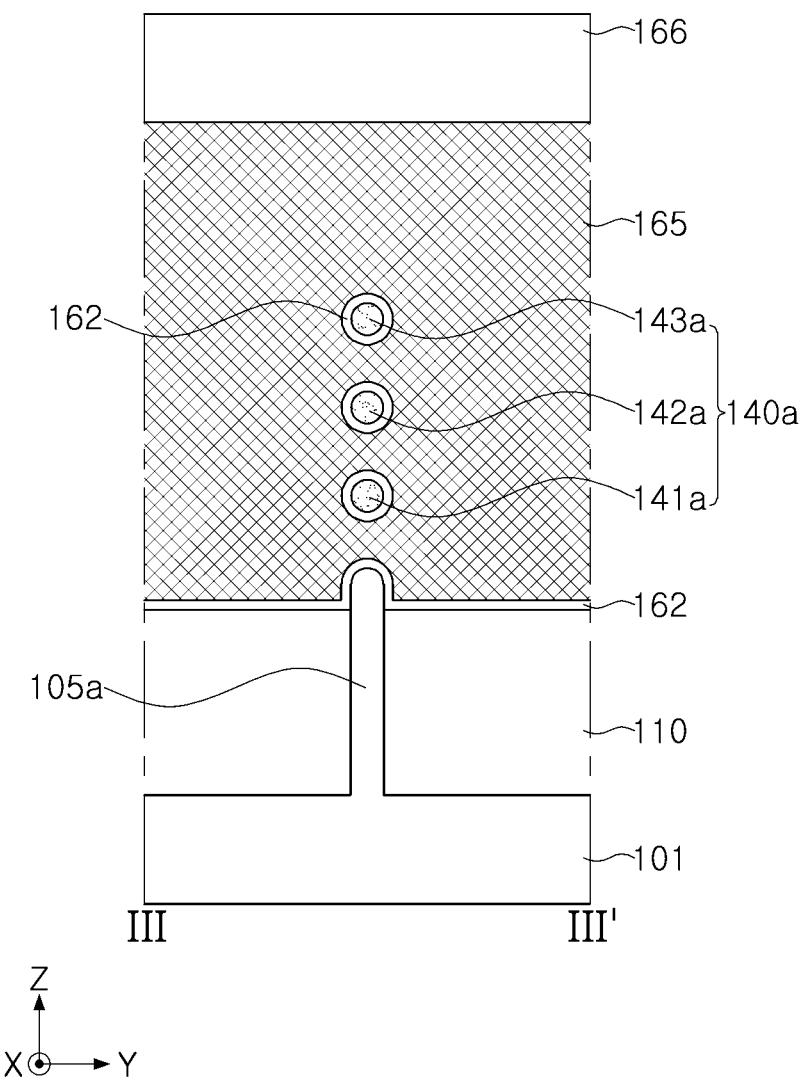
FIG. 6 is a cross-sectional view of a semiconductor device according to example embodiments.

FIG. 6 is a cross-sectional view of a semiconductor device according to example embodiments. FIG. 6 shows a cross-section corresponding to FIG. 2C.

Referring to FIG. 6, in the semiconductor device 100f, widths of an active region 105a and a channel structure 140a may be different from those of the example embodiment of FIG. 2. The active region 105a and the channel structure 140a may have a relatively narrow width, and accordingly, a plurality of channel layers 141a, 142a, and 143a of the channel structure 140a may have a circular shape or an elliptical shape with a small difference in length between a major axis and a minor axis in a cross-section along the Y direction, respectively. In an example embodiment, as illustrated in FIGS. 2A to 3A, the plurality of channel layers 141a, 142a, and 143a may have a width of about 20 nm to about 50 nm along the Y direction, and the plurality of channel layers 141a, 142a, and 143a of the present example embodiment may have a width of about 3 nm to about 12 nm along the Y direction. In an example embodiment, the width and shape of the active region 105a and the channel structure 140a may be variously changed.

Figure 7:
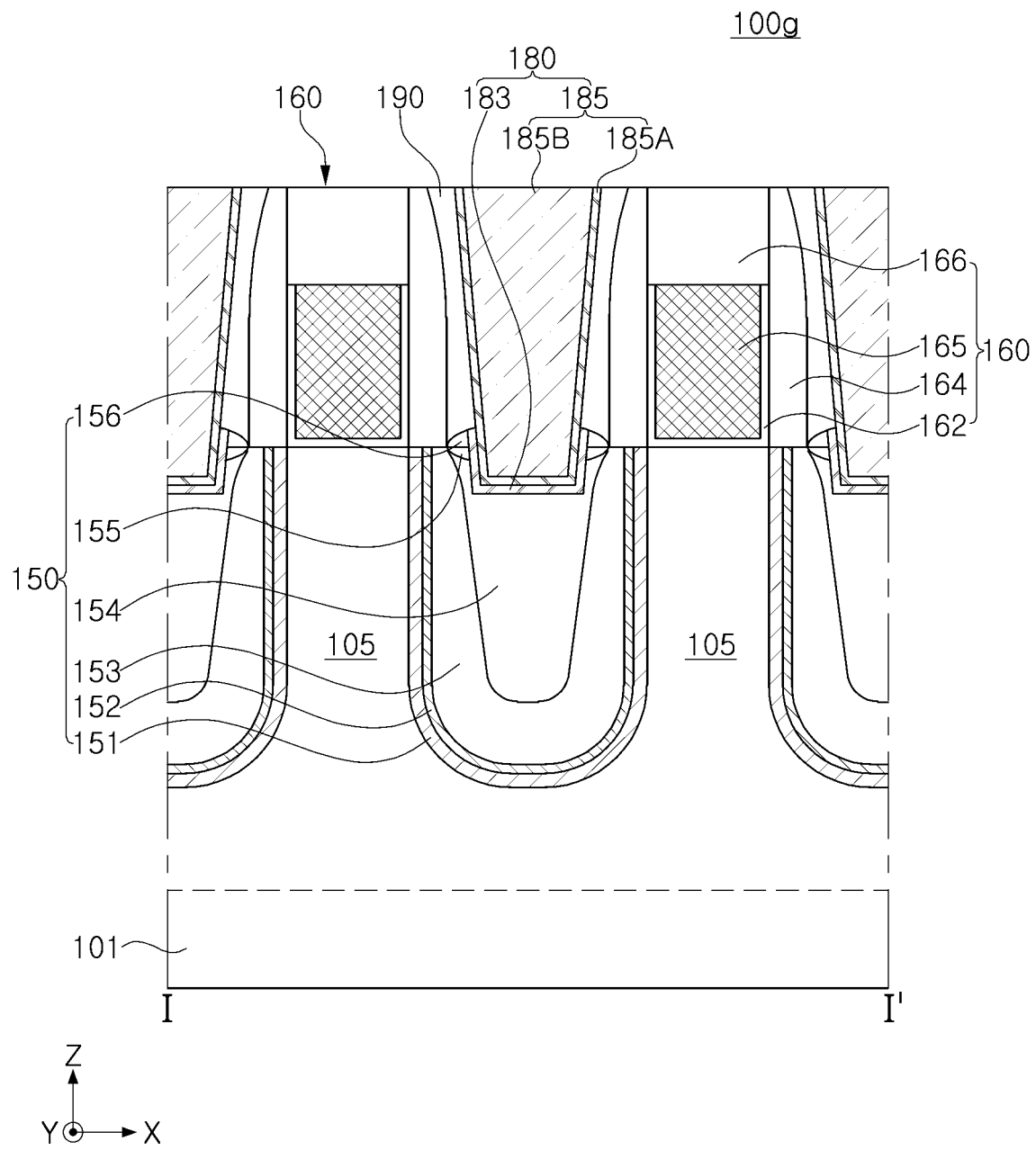
FIG. 7 is a cross-sectional view of a semiconductor device according to example embodiments.

FIG. 7 is a cross-sectional view of a semiconductor device according to example embodiments. FIG. 7 shows a cross-section corresponding to FIG. 2A.

Referring to FIG. 7, a semiconductor device 100g may include a FinFET in which the gate structure 160 surrounding three surfaces of the active region 105, e.g., the upper surface of the active region 105 and side surfaces thereof along the Y direction. Unlike the above-described embodiments, the semiconductor device 100g may not include a plurality of channel layers 141, 142, and 143. The semiconductor device 100g may include a channel region which is a part of the active region 105 and surrounded by the gate structure 160.

In an example embodiment, the structures of the first and second epitaxial layers 151 and 152 may be the same as those of the above-described embodiments. The first and second epitaxial layers 151 and 152 may help reduce lattice defects in the source/drain regions 150. The first epitaxial layer 151 may help suppress diffusion of impurities in the source/drain regions 150, and the second epitaxial layer 152 may help suppress diffusion of impurities and/or germanium elements in the source/drain regions 150.

FIGS. 8 to 15 are views of stages in a method of manufacturing a semiconductor device according to example embodiments.

Figure 8:
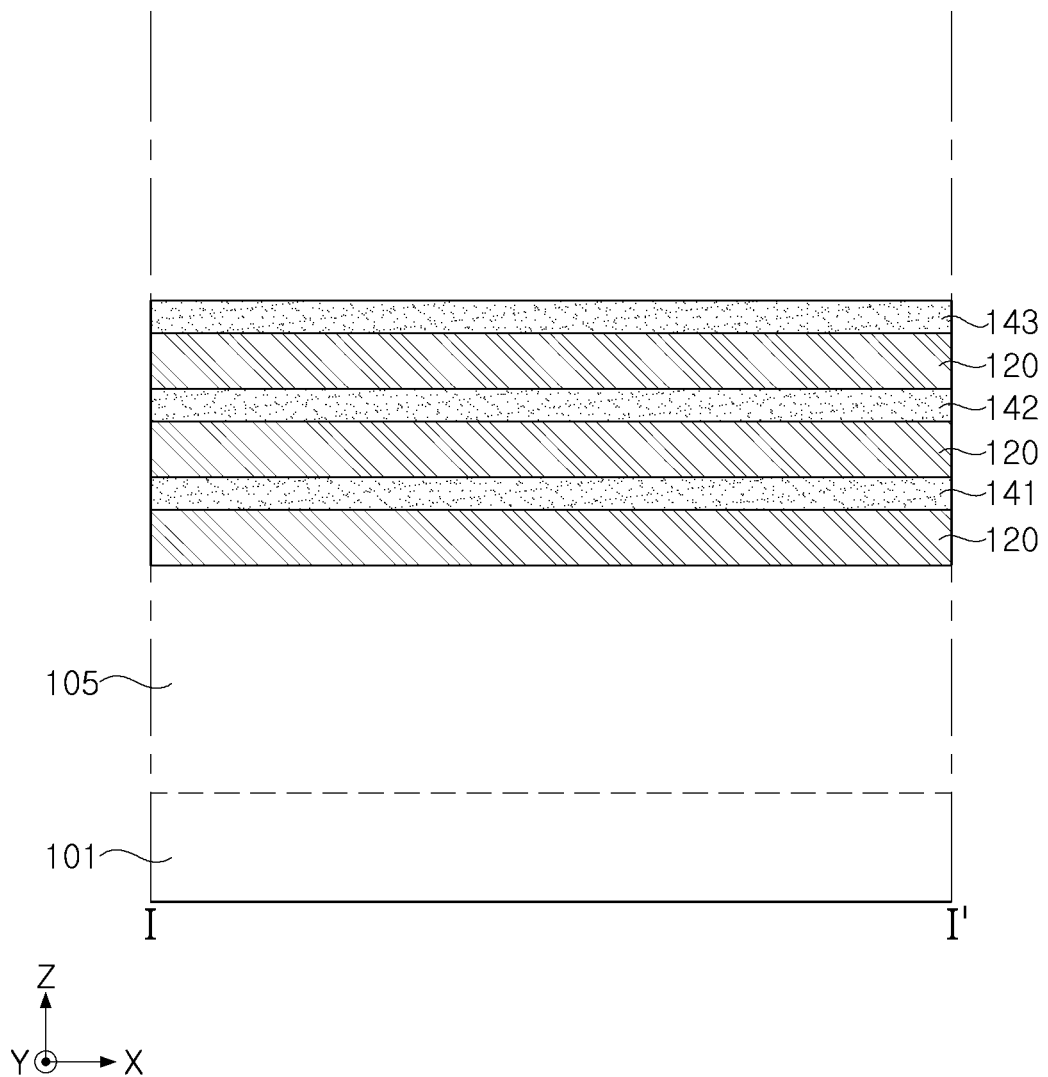
FIGS. 8 to 15 are views of stages in a method of manufacturing a semiconductor device according to example embodiments.

Referring to FIG. 8, sacrificial layers 120 and channel layers 141, 142, and 143 may be alternately stacked on a substrate 101. The sacrificial layers 120 may be layers that will be replaced with the gate dielectric layer 162 and the gate electrode 165 as shown in FIG. 2A through a subsequent process. The sacrificial layers 120 may be made of a material having etching selectivity with respect to the channel layers 141, 142, and 143. The channel layers 141, 142, 143 may include a material different from the sacrificial layers 120. The sacrificial layers 120 and the channel layers 141, 142, and 143 include, e.g., a semiconductor material including silicon (Si), silicon germanium (SiGe), or germanium (Ge), and may contain different materials, and may or may not contain impurities. In an example embodiment, the sacrificial layers 120 may include silicon germanium (SiGe), and the channel layers 141, 142, and 143 may include silicon (Si). The sacrificial layers 120 and the channel layers 141, 142, 143 may be formed by performing an epitaxial growth process using the substrate 101 as a seed. Each of the sacrificial layers 120 and the channel layers 141, 142, and 143 may have a thickness ranging from about 1 Å to about 100 nm. The number of layers of the channel layers 141, 142, and 143 alternately stacked with the sacrificial layer 120 may be variously changed in example embodiments.

Figure 9A:
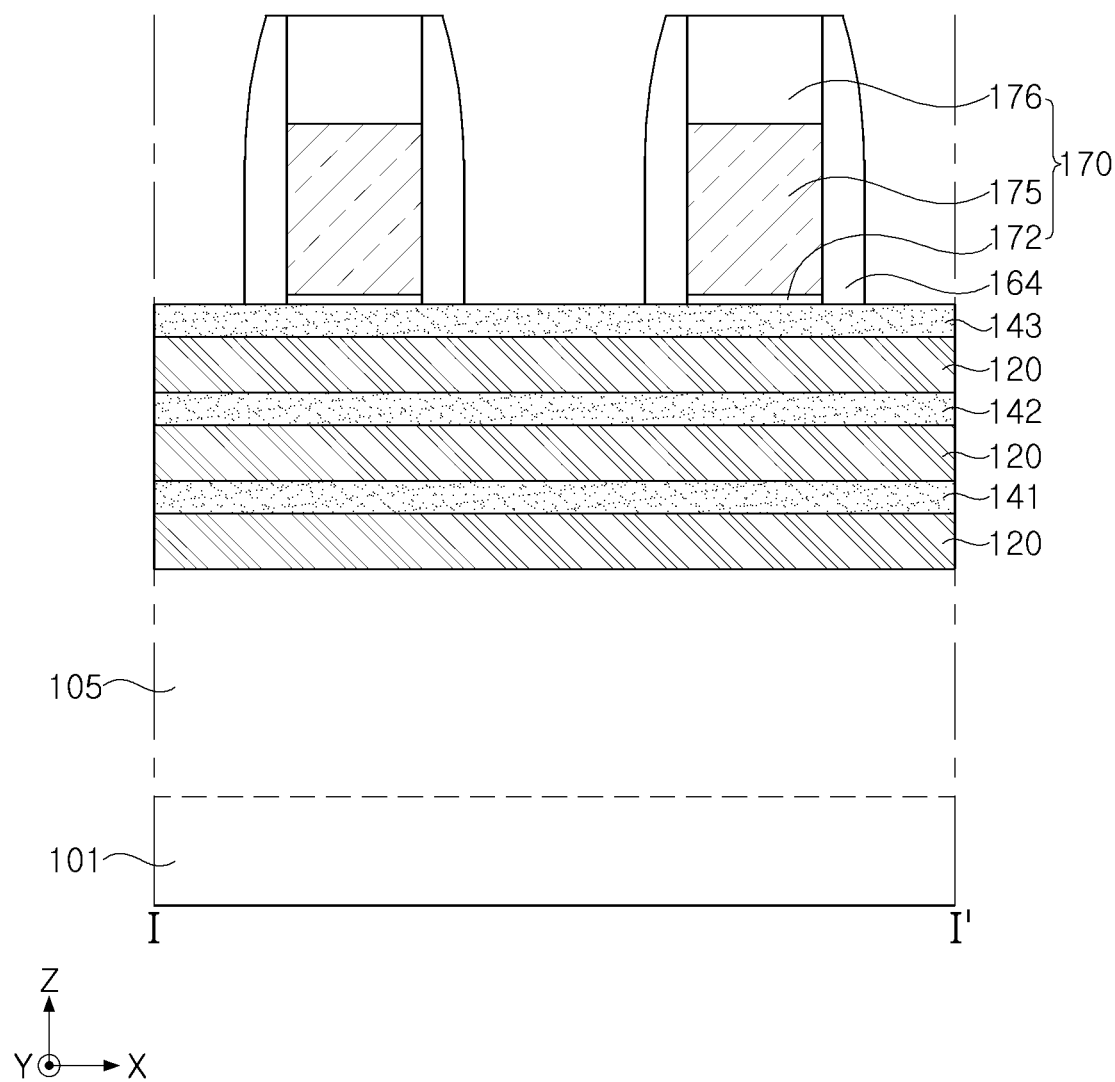
Figure 9B:
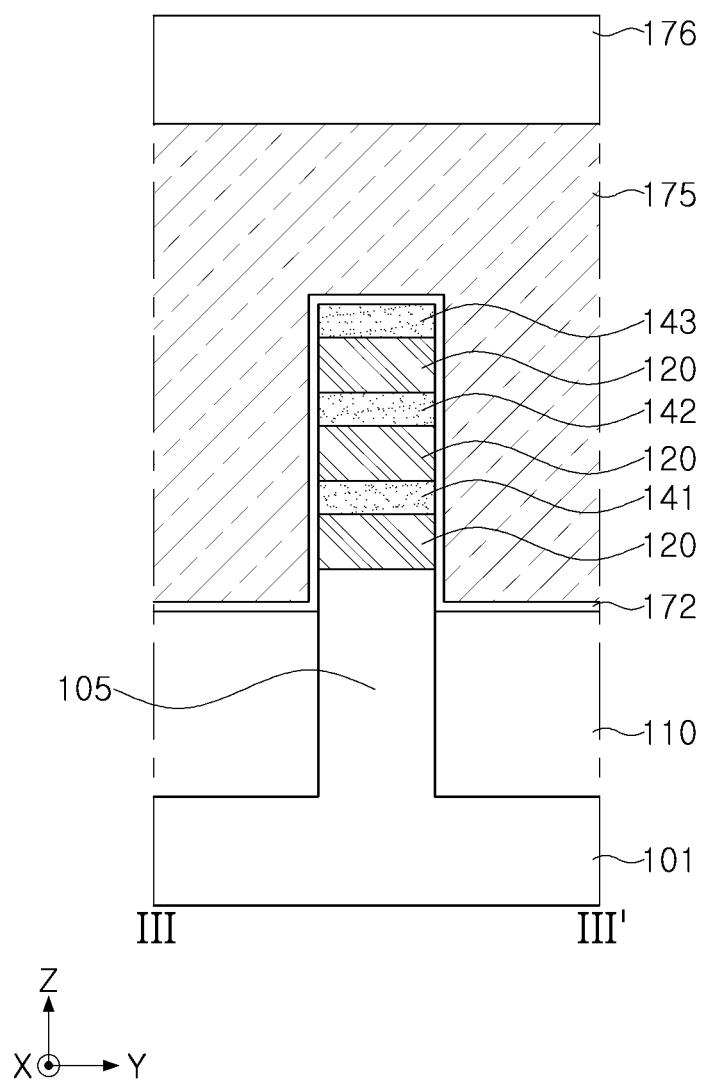

Referring to FIGS. 9A and 9B, active structures may be formed by removing a stacked structure of the sacrificial layers 120 and the channel layers 141, 142, and 143 and a portion of the substrate 101. Sacrificial gate structures 170 and spacer layers 164 may be formed on the active structure.

The active structure may include sacrificial layers 120 and channel layers 141, 142, and 143 alternately stacked with each other, and may further include an active region 105 in which a portion of the substrate 101 is removed to be formed to protrude to the upper surface of the substrate 101. The active structures may be formed in a line shape extending in one direction, e.g., in the X direction, and may be spaced apart from each other in the Y direction. Device isolation layers 110 may be formed in a region from which a portion of the substrate 101 is removed by filling an insulating material and then recessing the active region 105 such that the active region 105 protrudes. Upper surfaces of the device isolation layers 110 may be formed lower (e.g., closer to the substrate 101 in the Z direction) than the upper surface of the active region 105.

The sacrificial gate structures 170 may be sacrificial structures formed in a region in which the gate dielectric layer 162 and the gate electrode 165 are above the channel structures 140 through a subsequent process, as shown in FIG. 2A. The sacrificial gate structure 170 may include first and second sacrificial gate layers 172 and 175, which are sequentially stacked, and a mask pattern layer 176.

The first and second sacrificial gate layers 172 and 175 may be patterned using the mask pattern layer 176. The first and second sacrificial gate layers 172 and 175 may be an insulating layer and a conductive layer, respectively, and the first and second sacrificial gate layers 172 and 175 may be formed as a single layer. In an example embodiment, the first sacrificial gate layer 172 may include a silicon oxide, and the second sacrificial gate layer 175 may include polysilicon.

The mask pattern layer 176 may include a silicon oxide or a silicon nitride. The sacrificial gate structures 170 may have a line shape extending in one direction intersecting the active structure. The sacrificial gate structures 170 may extend in the Y direction, e.g., and may be spaced apart from each other in the X direction.

The spacer layers 164 may be formed on both sidewalls of the sacrificial gate structures 170. The spacer layers 164 may be formed by forming a film having a uniform thickness along the upper surfaces and side surfaces of the sacrificial gate structures 170 and the active structures, and then anisotropic etching. The spacer layers 164 may be made of a low dielectric constant material, and may include, e.g., SiO, SiN, SiCN, SiOC, SiON, or SiOCN. The spacer layers 164 may include a plurality of insulating layers having different compositions.

Figure 10:
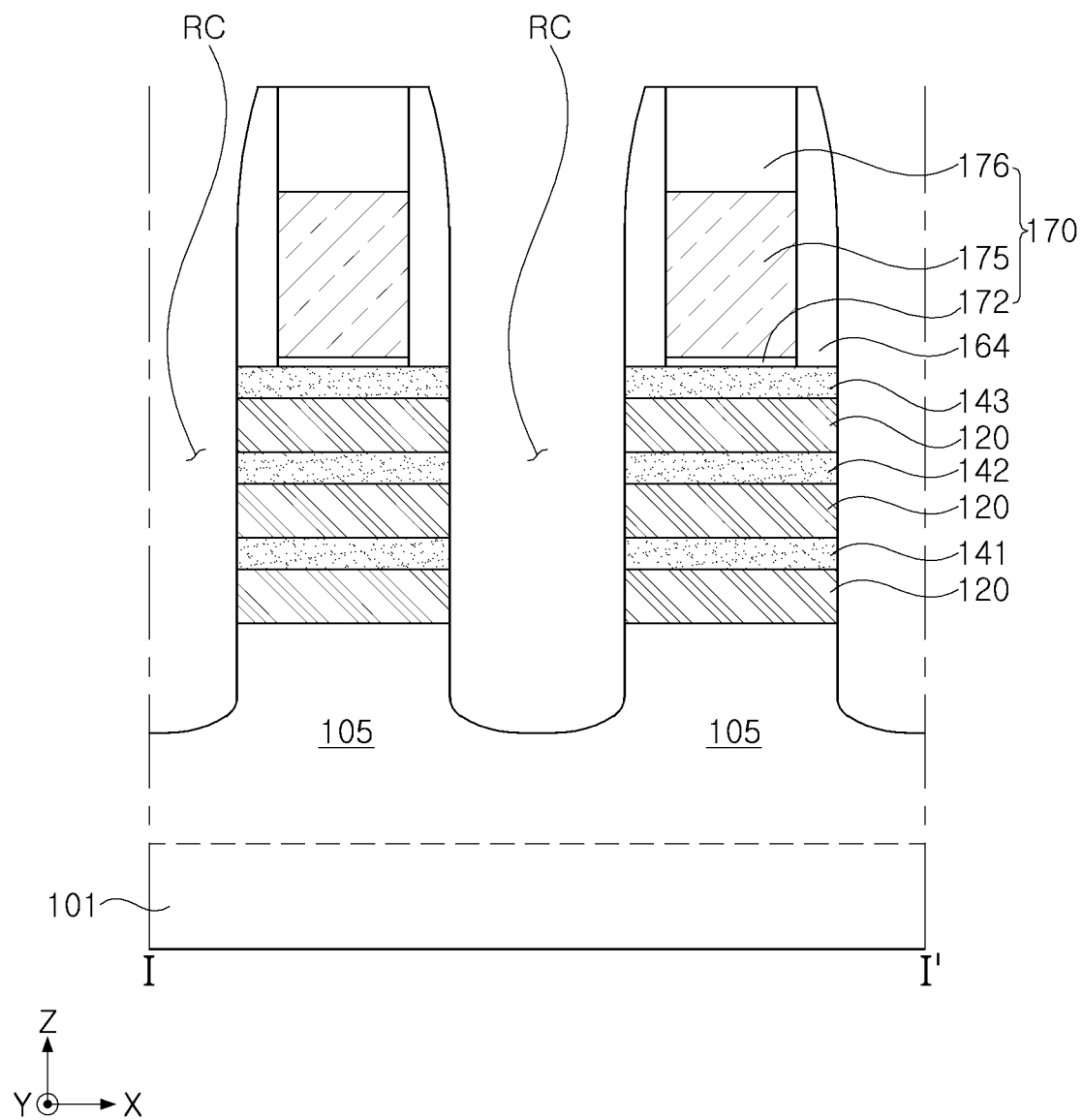

Referring to FIG. 10, between the sacrificial gate structures 170, the exposed sacrificial layers 120 and the channel layers 141, 142, and 143 may be removed to form recess regions RC.

The exposed sacrificial layers 120 and channel layers 141, 142, and 143 may be removed by using the sacrificial gate structures 170 and the spacer layers 164 as masks. The recess regions RC may be formed on the active region 105 on both sides of the sacrificial gate structures 170. A portion of the upper surface of the substrate 101 may be exposed by the recess regions RC. To remove the sacrificial layers 120 and the channel layers 141, 142, and 143, e.g., an anisotropic dry etching process may be used.

Figure 11:
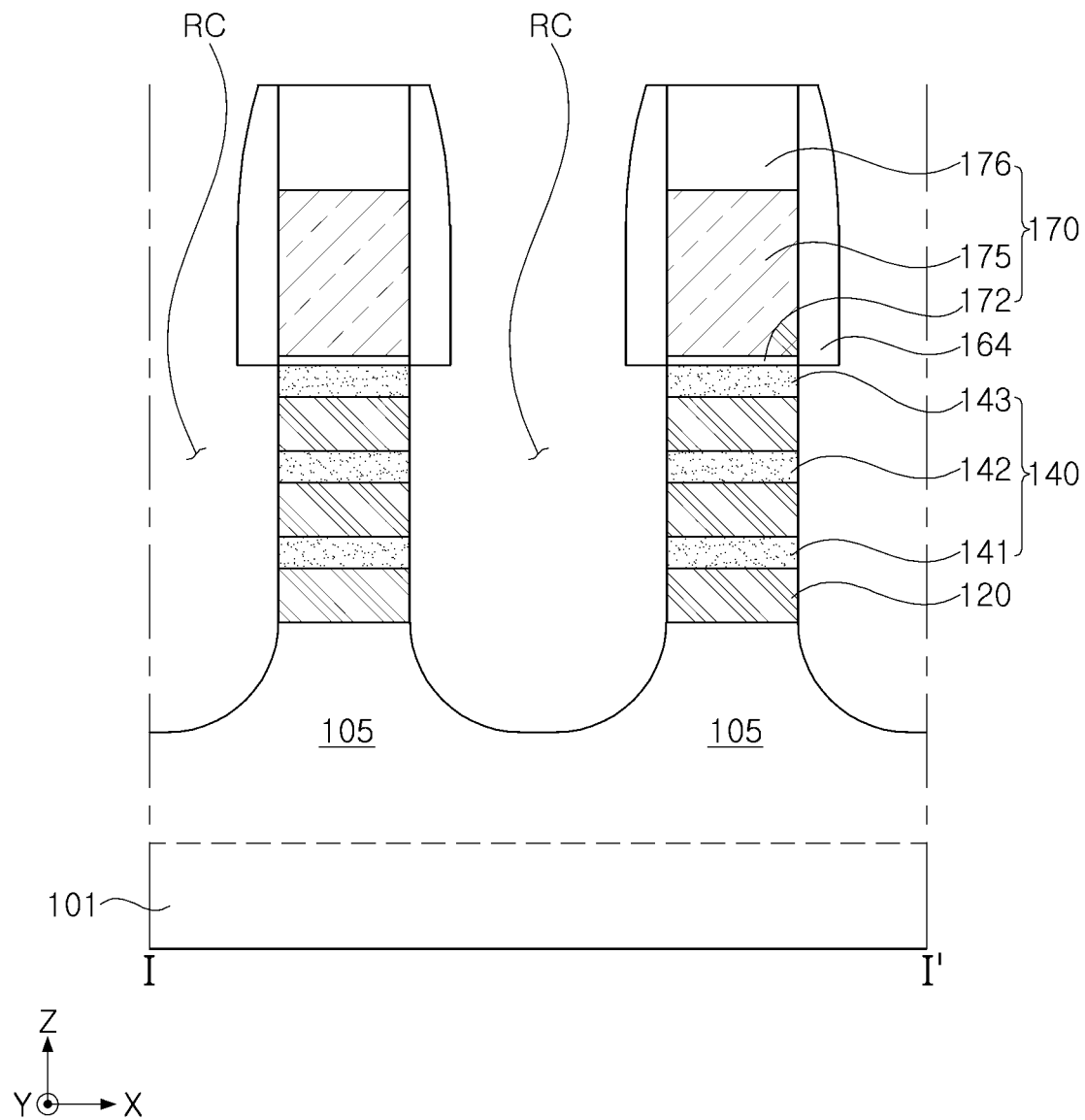

Referring to FIG. 11, channel structures 140 may be formed by expanding recess regions RC. The recess regions RC may expand below the spacer layers 164. The upper surface of the substrate 101 exposed by the recess regions RC may also be additionally etched. To expand the recess regions RC, e.g., an isotropic etching process may be used. As a result, the channel layers 141, 142, and 143 have a limited length along the X direction and form the channel structure 140.

Figure 12:
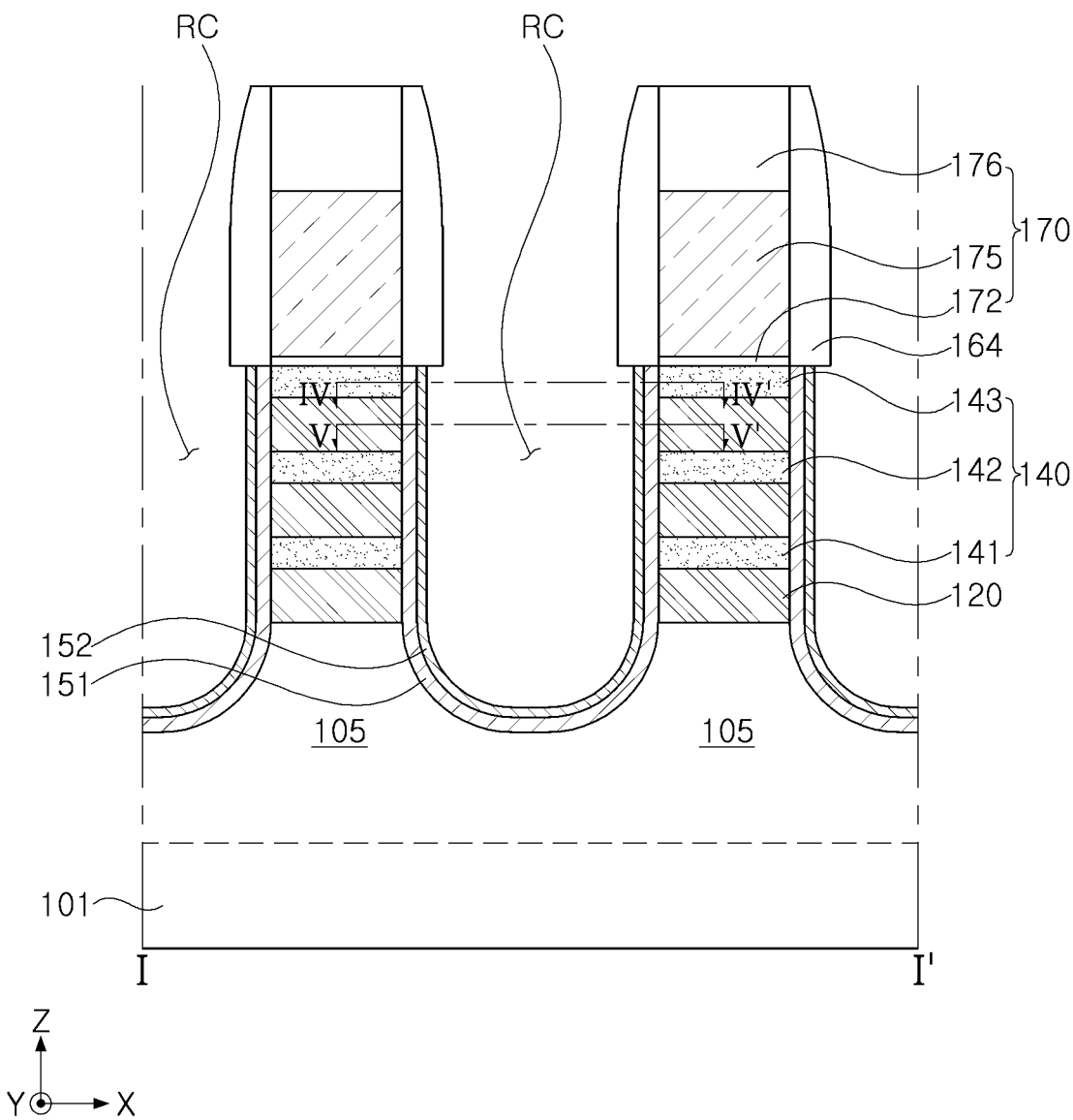
Figure 13A:
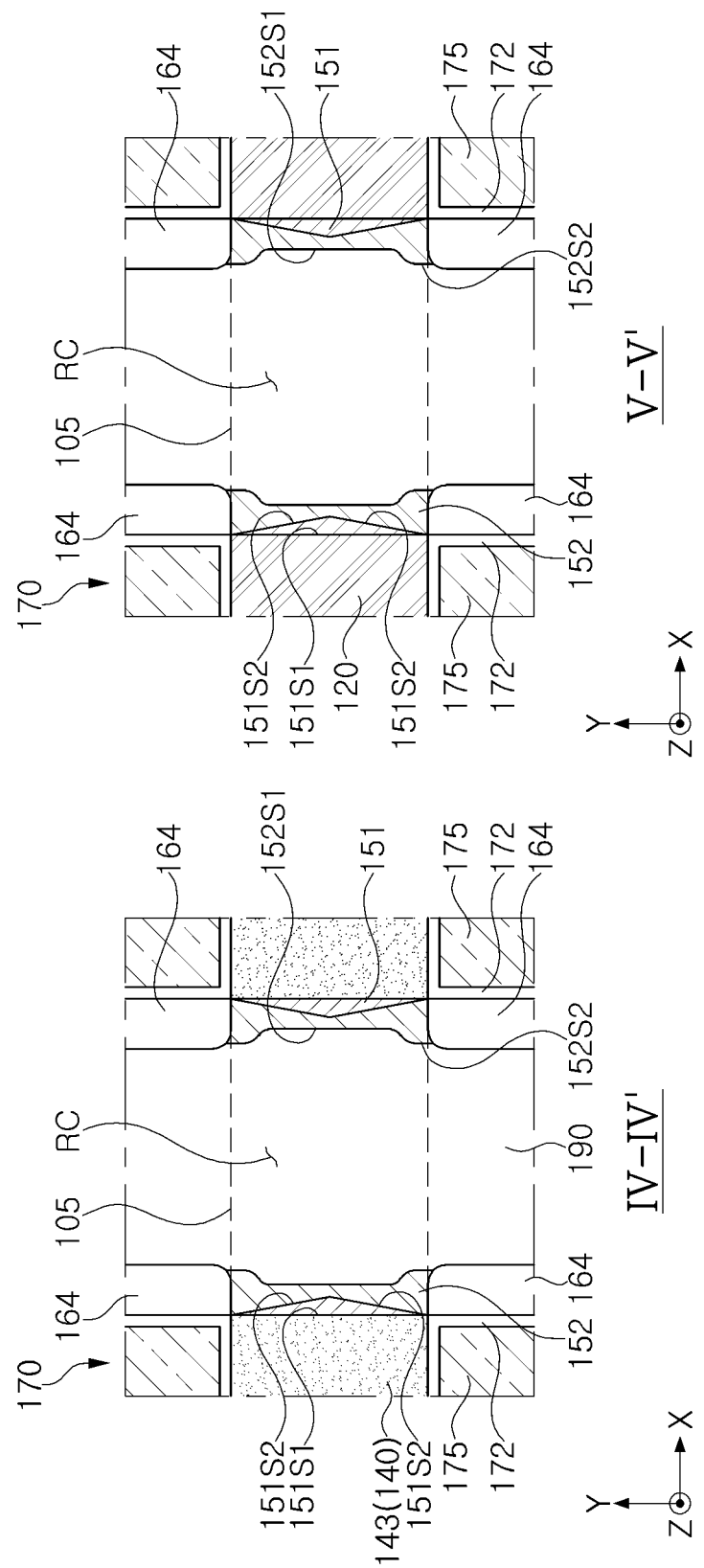
Figure 13B:
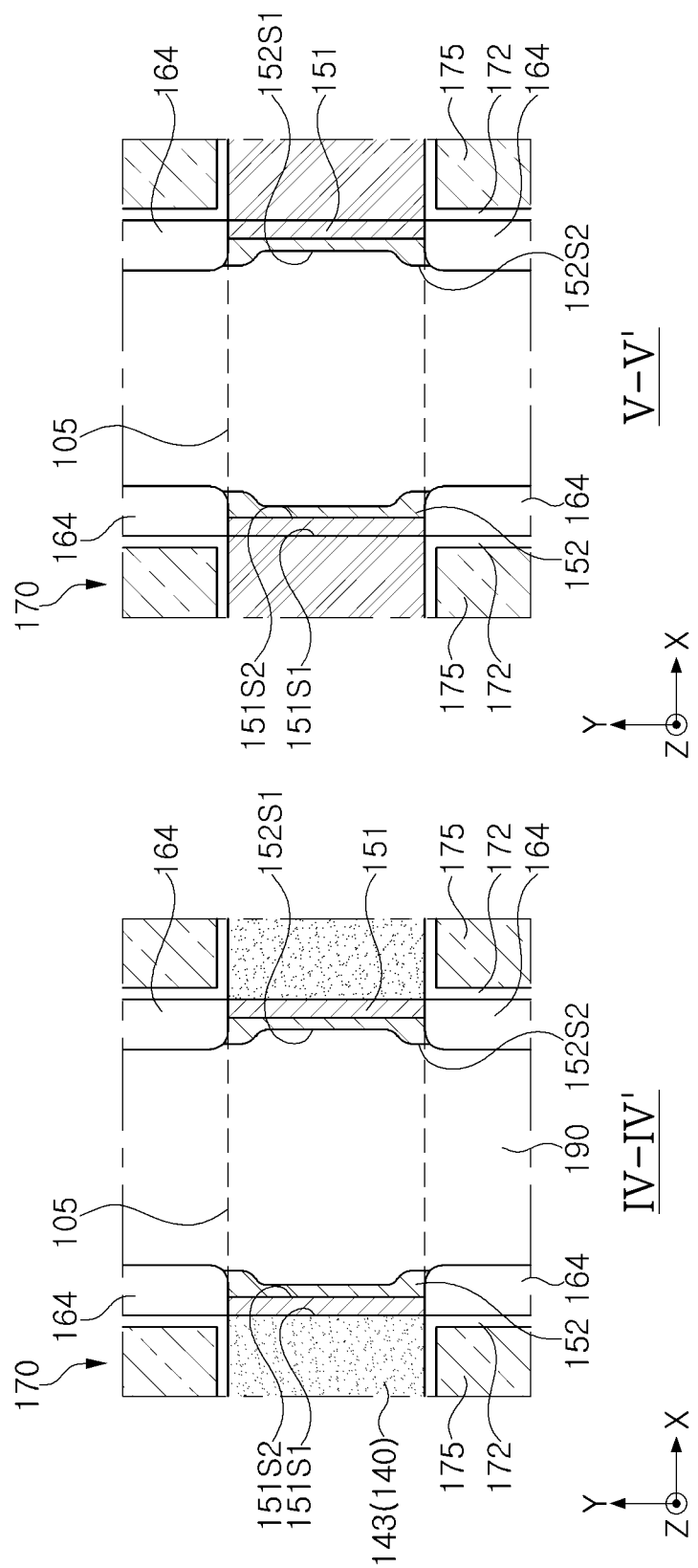

Referring to FIG. 12, a first epitaxial layer 151 and a second epitaxial layer 152 may be formed in recess regions RC. FIGS. 13A to 13B are cross-sectional views of the semiconductor device in a process of being manufactured in FIG. 12 taken along lines IV-IV' and V-V', respectively.

FIGS. 13A to 13D illustrate regions corresponding to cross-sections of the first and second epitaxial layers 151 and 152 cut in the horizontal direction in FIG. 12. The first epitaxial layer 151 may be formed by growing from the sacrificial layers 120 and the channel layers 141, 142 and 143 using a selective epitaxial growth (SEG) process.

The first epitaxial layer 151 may include first impurities, e.g., p-type impurities, by in-situ doping. The first epitaxial layer 151 may expand downwardly along side surfaces of the sacrificial layers 120 and side surfaces of the channel layers 141, 142, and 143, and may be formed such that a lower end thereof contacts the active region 105 of the substrate 101. As illustrated in FIGS. 3A and 13A, the first epitaxial layer 151 may be formed to have portions having different thicknesses in the X direction. As shown in FIGS. 3A and 13A, the first epitaxial layer 151 may be formed to have a maximum thickness in the X direction from a central portion.

The second epitaxial layer 152 may be grown from the first epitaxial layer 151 using an SEG process. The second epitaxial layer 152 may include first impurities, e.g., p-type impurities, by in-situ doping. The second epitaxial layer 152 may further include a second impurity including carbon (C) by in-situ doping.

Carbon (C) may be doped in the second epitaxial layer 152 at a concentration of about $2.5 \times 10^{20}/cm^3$ to about $2 \times 10^{21}/cm^3$. When the second epitaxial layer 152 is doped with carbon at about $2.5 \times 10^{20}/cm^3$ or greater, an effect of preventing diffusion of impurities and germanium elements may be sufficient. When the second epitaxial layer 152 is doped with carbon at about $2 \times 10^{21}/cm^3$ or less, resistance of the source/drain regions 150 may be maintained. As shown in FIGS. 3A and 13A, the second epitaxial layer 152 may be formed to have portions having different thicknesses in the X direction. As shown in FIGS. 3A and 13A, the second epitaxial layer 152 may be formed to have a maximum thickness in the X direction in a peripheral portion P2. The peripheral portion P2 of the second epitaxial layer 152 may be formed to cover the peripheral portion P1 of the first epitaxial layer 151.

Figure 13C:
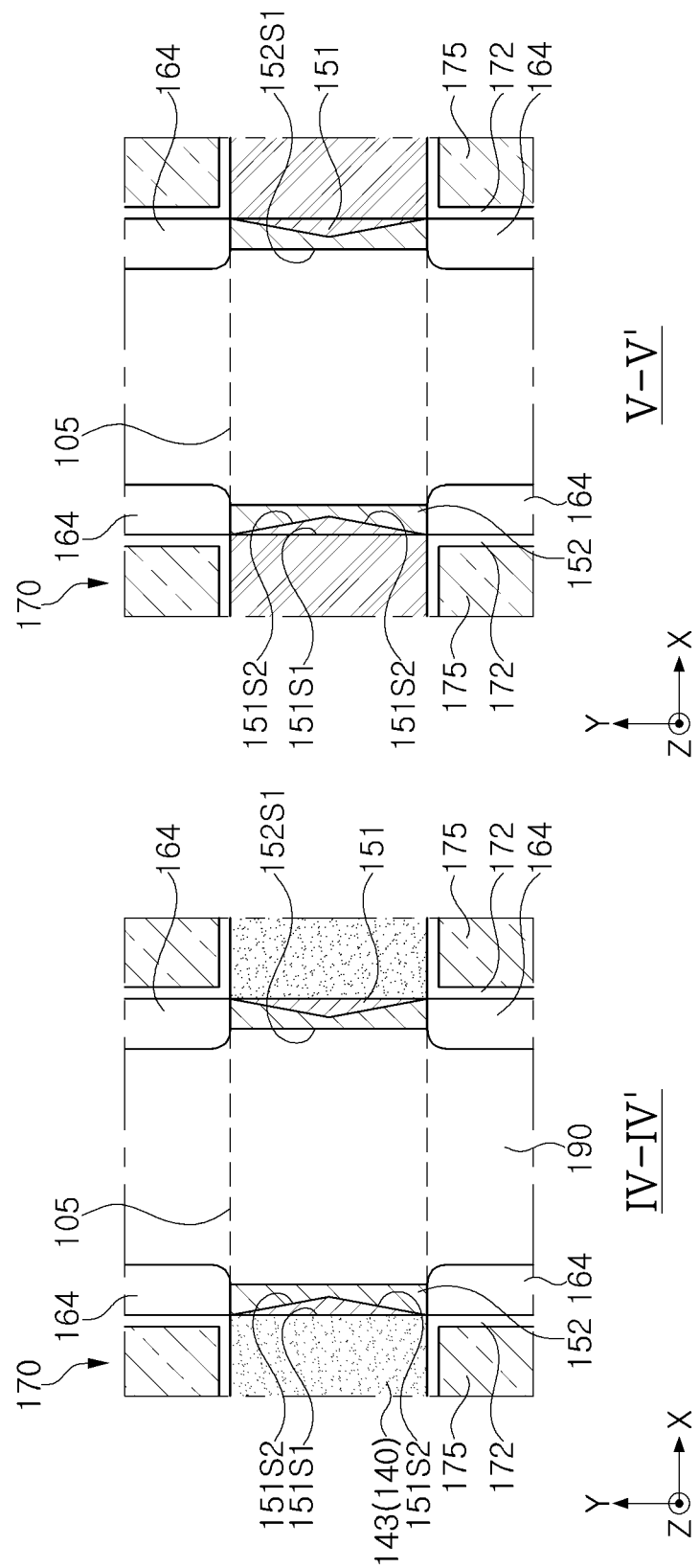
Figure 13D:
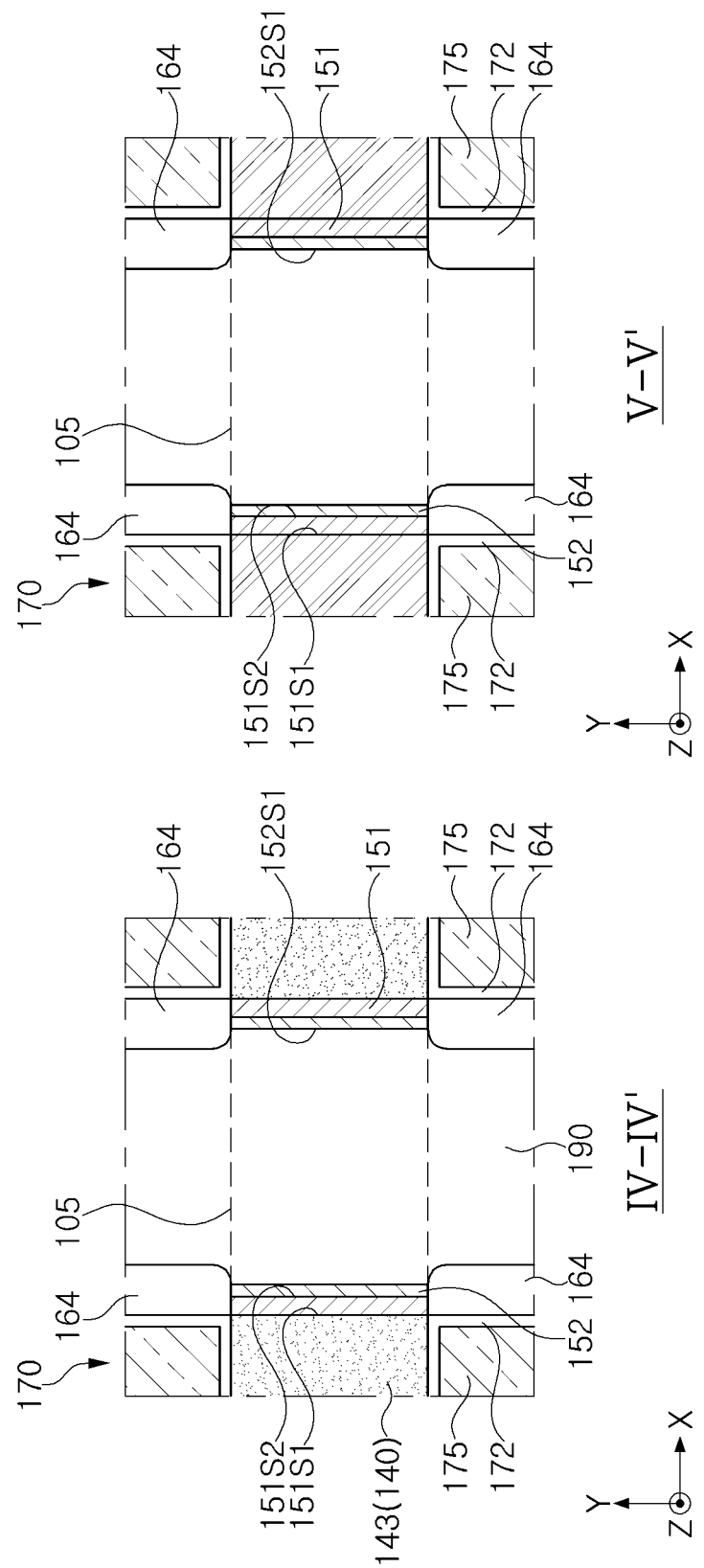

In the case of the example embodiments of FIGS. 3B to 3D, as shown in FIGS. 13B to 13D, in the present step, it may be manufactured by controlling a growth rate and a growth thickness of the first epitaxial layer 151 and the second epitaxial layer 152. In the case of the example embodiment of FIG. 4, in the present step, it may be manufactured by controlling the growth rate and the growth thickness of the second epitaxial layer 152.

In the case of the embodiment of FIGS. 5A and 5B, in the present step, it may be manufactured by not forming the first epitaxial layer 151, but forming the second epitaxial layer 152 in the recess regions RC.

Figure 14A:
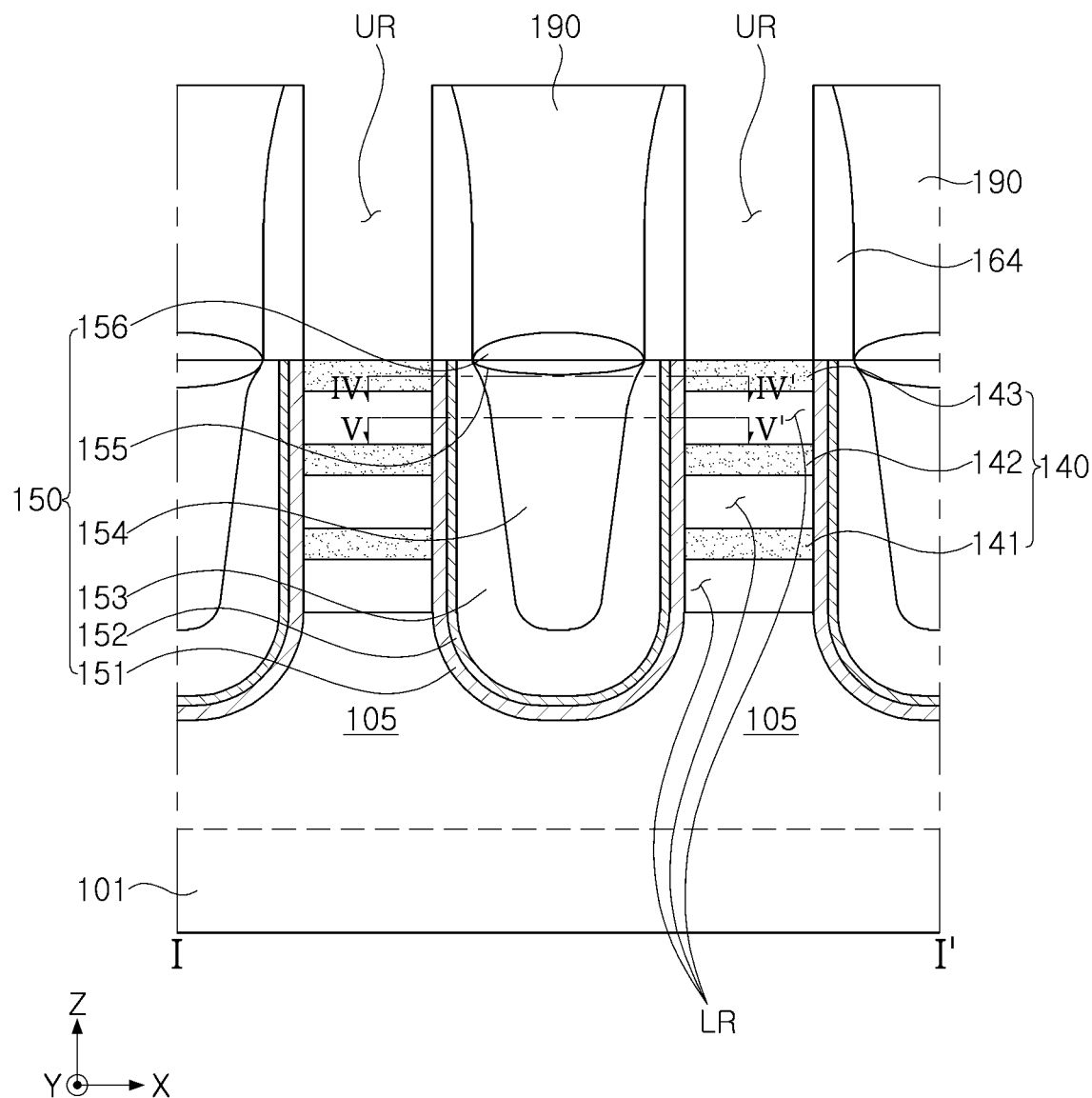
Figure 14B:
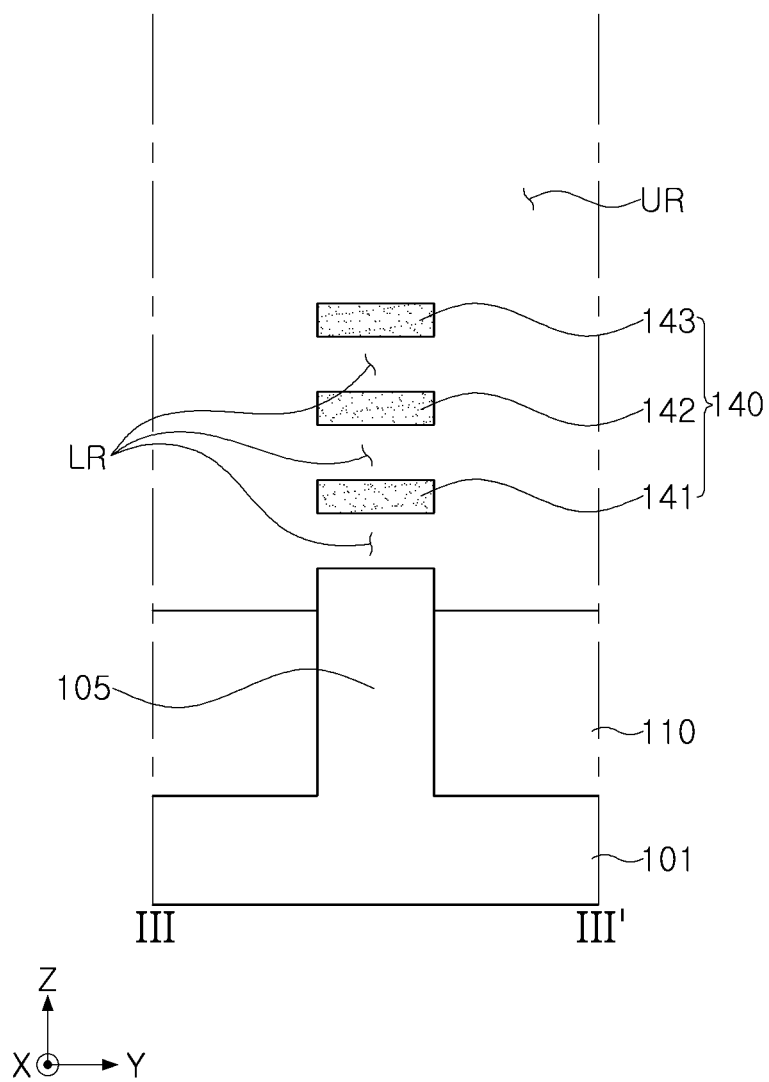
Figure 14C:
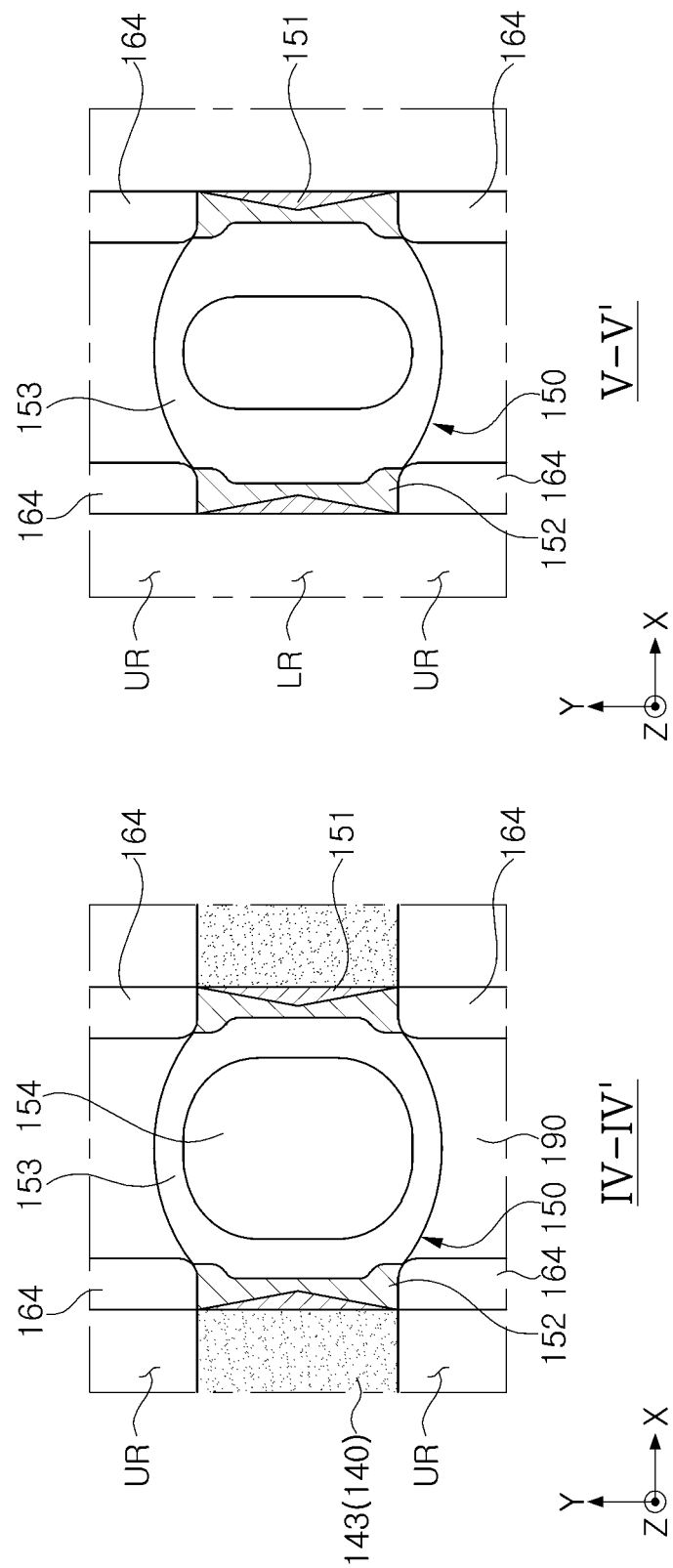

Referring to FIGS. 14A, 14B, and 14C, third to sixth epitaxial layers 153, 154, 155, and 156 of the source/drain regions 150 may be formed to fill recess regions RC. An interlayer insulating layer 190 may be formed between the spacer layers 164 to cover the source/drain regions 150, and sacrificial layers 120 and sacrificial gate structures 170 may be removed.

FIG. 14C illustrates cross-sections of the semiconductor device in the process of manufacturing in FIG. 14A taken along lines IV-IV' and V-V', respectively.

Third to sixth epitaxial layers 154, 154, 155, and 156 may be formed using a SEG process, respectively. The third to sixth epitaxial layers 153, 154, 155, and 156 may include first impurities doped with in-situ, e.g., p-type impurities.

The third to sixth epitaxial layers 153, 154, 155, and 156 may include silicon-germanium whose germanium concentration is sequentially increased. At least one of the third to sixth epitaxial layers 153, 154, 155, and 156, e.g., the fifth epitaxial layer 155 may be formed of silicon. Accordingly, the source/drain regions 150 may be finally formed.

The plurality of epitaxial layers in the source/drain regions 150 may be formed of materials having different compositions, and a boundary between the plurality of epitaxial layers in the source/drain regions 150 can be substantially classified by an analysis such as a Transmission Electron Microscopy Energy Dispersive X-ray (TEM-EDX) spectroscopy, or the like. An interlayer insulating layer 190 may be formed by forming an insulating layer covering the sacrificial gate structure 170 and the source/drain regions 150 and performing a planarization process. The sacrificial layers 120 and the sacrificial gate structures 170 may be selectively removed from the spacer layers 164, the interlayer insulating layer 190, and the channel structures 140. First, the sacrificial gate structures 170 may be removed to form upper gap regions UR, and then the sacrificial layers 120 exposed through the upper gap regions UR may be removed to form lower gap regions LR. In an example embodiment, the sacrificial layers 120 may include silicon germanium (SiGe) and the channel structures 140 include silicon (Si), and the sacrificial layers 120 may be selectively removed by performing a wet etching process using peracetic acid as an etchant.

Referring to FIGS. 14A and 14C, in a process in which the sacrificial layers 120 are removed, the first peripheral portion P1 or end portions of the first epitaxial layer 151 may be portions in which an etchant is easily penetrated through the upper gap regions UR and lower gap regions LR.

When the etchant flows into the source/drain regions 150, the source/drain regions 150 including silicon-germanium could be damaged. In an example embodiment, by forming the second epitaxial layer 152 to have a relatively thick thickness to cover the first peripheral portion P1 or end portions of the first epitaxial layer 151, damage to the source/drain regions 150 due to the inflow of etchant may be prevented.

In addition, in the process of removing the sacrificial layers 120, the first epitaxial layer 151 may be maintained to have a low germanium concentration, so that the sacrificial layers 120 may be selectively removed to the first epitaxial layer 151.

In the source/drain region 150, when germanium is diffused from epitaxial layers containing a high concentration of germanium to the first epitaxial layer 151, etching selectivity of the sacrificial layers 120 and the first epitaxial layer 151 may be lowered, and the source/drain regions 150 could be damaged by the etchant. In an example embodiment, diffusion of germanium into the first epitaxial layer 151 may be prevented by doping carbon in the second epitaxial layer 152. Accordingly, by increasing the etching selectivity between the sacrificial layers 120 and the first epitaxial layer 151, it is possible to help prevent the source/drain regions 150 from being damaged during the process of removing the sacrificial layers 120.

Figure 15:
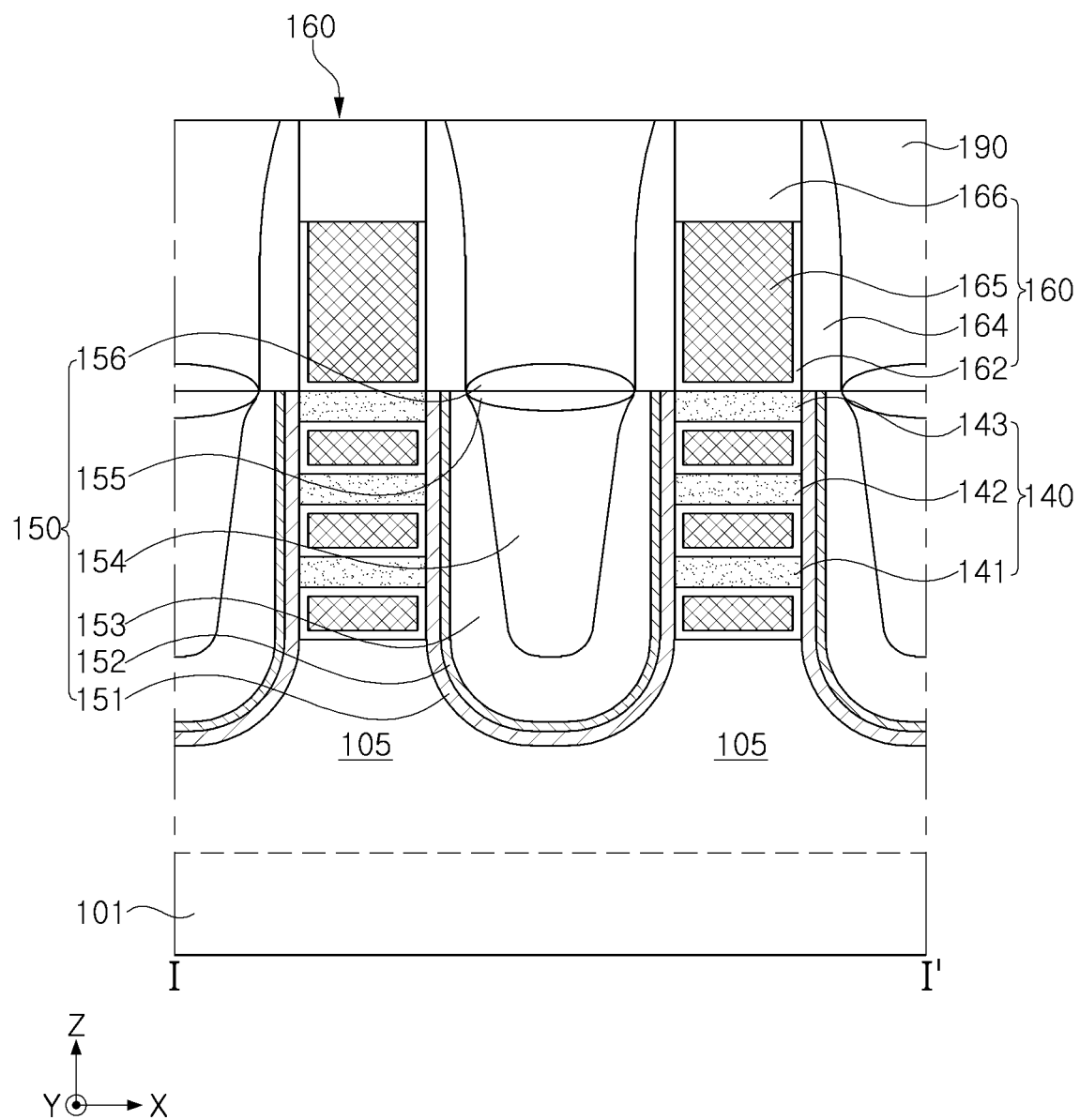

Referring to FIG. 15, gate structures 160 may be formed in upper gap regions UR and lower gap regions LR.

Gate dielectric layer 162 may be formed to conformally cover inner surfaces of the upper gap regions UR and lower gap regions LR. The gate electrodes 165 may be formed. After gate electrodes 165 are formed to completely fill the upper gap regions UR and the lower gap regions LR, the gate electrodes 165 may be removed from above the upper gap regions UR to a predetermined depth. A gate capping layer 166 may be formed in a region in which the gate electrodes 165 are removed from the upper gap regions UR. Thereby, gate structures 160 including the gate dielectric layer 162, the gate electrode 165, the spacer layers 164, and the gate capping layer 166 may be formed.

Next, referring to FIG. 2A, the contact structure 180 may be formed. Accordingly, the semiconductor device 100 of FIGS. 1 to 3A may be manufactured. First, an interlayer insulating layer 190 may be patterned to form a contact hole, and a conductive material may be filled in the contact hole to form a contact plug 185. Before forming the contact plug 185, a metal-semiconductor compound layer 183 may be formed in the source/drain region 150 exposed through the contact hole. Forming the contact plug 185 may include sequentially forming a first conductive layer 185A and a second conductive layer 185B. The lower surface of the contact hole may be recessed into source/drain regions 150 or may have a curve along upper surfaces of the source/drain regions 150d. In an example embodiment, the shape and disposition of the contact plug 185 may be variously changed.

As set forth above, by disposing the second epitaxial layer doped with carbon on a side surface of the first epitaxial layer, diffusion of impurities and germanium may be suppressed, the channel layer and the source/drain region may be prevented from being damaged, such that a semiconductor device having improved reliability and electrical characteristics may be provided.

By disposing the second epitaxial layer doped with carbon so as to cover a peripheral portion of the first epitaxial layer, having a thin thickness with a relatively thick thickness, an etchant may be prevented from entering the source/drain region, such that a semiconductor device having improved reliability and electrical properties can be provided.

By way of summation and review, in manufacturing a semiconductor element having a fine pattern, corresponding to a tendency for high integration of semiconductor devices, patterns having a fine width or a fine spacing distance may be implemented. In addition, to overcome limitations of operating characteristics due to reductions in the size of a planar metal oxide semiconductor FET (MOSFET), a semiconductor device including a FinFET having a channel having a three-dimensional structure may be considered.

One or more embodiments may provide a semiconductor device having improved reliability and electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region extending in a first direction on a substrate;

a plurality of channel layers vertically spaced apart from each other on the active region;

a gate structure extending in a second direction and intersecting the active region and the plurality of channel layers on the substrate, the gate structure surrounding the plurality of channel layers;

a source/drain region on the active region on at least one side of the gate structure and in contact with the plurality of channel layers; and a contact plug connected to the source/drain region and extending in a vertical direction, wherein:

the source/drain region includes a first epitaxial layer on side surfaces of the plurality of channel layers and including a first impurity; a second epitaxial layer on the first epitaxial layer and including the first impurity and a second impurity; and a third epitaxial layer on the second epitaxial layer and including the first impurity, in a horizontal sectional view of a plane at a height level of one of the plurality of channel layers, the second epitaxial layer includes a peripheral portion having a thickness measured in the first direction that increases along the second direction, a sum of thicknesses of the first epitaxial layer and the second epitaxial layer is about 2 nm to about 5 nm, and the second epitaxial layer has a maximum thickness within a range from about 35% to less than 100% of the sum of the thicknesses of the first epitaxial layer and the second epitaxial layer.

2. The semiconductor device as claimed in claim 1, wherein:

the first impurity includes boron (B), and the second impurity includes carbon (C).

3. The semiconductor device as claimed in claim 2, wherein:

the second epitaxial layer includes silicon-germanium, and the second epitaxial layer includes carbon in a concentration of about 0.5 atomic % to about 4 atomic %.

4. The semiconductor device as claimed in claim 3, wherein:

the first epitaxial layer includes silicon-germanium, and a germanium concentration of the second epitaxial layer is greater than a germanium concentration of the first epitaxial layer.

5. The semiconductor device as claimed in claim 1, wherein, in the horizontal sectional view, the second epitaxial layer includes:

a substantially flat first surface, and a second surface that is a curved surface bent from the first surface and convex in a direction away from the gate structure.

6. The semiconductor device as claimed in claim 1, wherein, in the horizontal sectional view, one surface of the second epitaxial layer, which is in contact with the third epitaxial layer, includes a portion that is concave inwardly toward the first epitaxial layer.

7. The semiconductor device as claimed in claim 1, wherein, in the horizontal sectional view, one surface of the second epitaxial layer, which is in contact with the third epitaxial layer, is substantially flat.

8. The semiconductor device as claimed in claim 1, wherein, in the horizontal sectional view, the first epitaxial layer includes:

a central portion having a first thickness, which is a maximum thickness of the first epitaxial layer as measured in the first direction, and a peripheral portion whose thickness in the first direction decreases toward an end portion thereof along the second direction.

9. The semiconductor device as claimed in claim 1, wherein, in the horizontal sectional view:

the second epitaxial layer includes a central portion having a first thickness in the first direction, and the thickness of the peripheral portion of the second epitaxial layer in the first direction is a second thickness, and the second thickness is more than 1 to about 2 times the first thickness.

10. The semiconductor device as claimed in claim 1, wherein an upper end of the second epitaxial layer is located at a higher height level than an upper end of the first epitaxial layer.

11. A semiconductor device, comprising:

an active region extending in a first direction on a substrate;

a plurality of channel layers vertically spaced apart from each other on the active region;

a gate structure extending in a second direction and intersecting the active region and the plurality of channel layers on the substrate, the gate structure surrounding the plurality of channel layers; and a source/drain region on the active region on at least one side of the gate structure and in contact with the plurality of channel layers, wherein:

the source/drain region includes a first epitaxial layer in contact with side surfaces of the plurality of channel layers and the active region and including silicon-germanium (SiGe) and boron (B); and a second epitaxial layer on the first epitaxial layer and including silicon-germanium (SiGe), boron (B), and carbon (C), the second epitaxial layer covers end portions of the first epitaxial layer in the second direction, and in a horizontal sectional view at a plane passing through the source/drain region, the first epitaxial layer has a triangular shape or a quadrangular shape.

12. The semiconductor device as claimed in claim 11, wherein the second epitaxial layer includes carbon in a concentration of about 0.5 atomic % to about 4 atomic %.

13. The semiconductor device as claimed in claim 11, wherein, in the horizontal sectional view at the plane passing through the source/drain region:

the first epitaxial layer includes a first central portion having a first thickness in the first direction, and a first peripheral portion having a second thickness in the first direction, the second thickness being smaller than the first thickness, and the second epitaxial layer includes a second central portion having a third thickness in the first direction, and a second peripheral portion having a fourth thickness in the first direction, the fourth thickness being greater than the third thickness.

14. The semiconductor device as claimed in claim 13, wherein a sum of the second thickness and the fourth thickness is greater than a sum of the first thickness and the third thickness.

15. A semiconductor device, comprising:

an active region extending in a first direction on a substrate;

a gate structure extending in a second direction, perpendicular to the first direction, and intersecting the active region; and a source/drain region on a recessed region of the active region at both sides of the gate structure, the source/drain region including a plurality of epitaxial layers, wherein:

the plurality of epitaxial layers of the source/drain region include:
- a first epitaxial layer covering an inner wall of the recessed region of the active region; and
- a second epitaxial layer on the first epitaxial layer, in the recessed region of the active region, the first epitaxial layer and the second epitaxial layer include silicon-germanium (SiGe) having different compositions, each of the first epitaxial layer and the second epitaxial layer includes a first impurity including boron (B), the second epitaxial layer further includes a second impurity including carbon (C), at least one of the first epitaxial layer and the second epitaxial layer includes different portions having different thicknesses in the first direction, and in a horizontal sectional view along a plane passing through the source/drain region:
- the first epitaxial layer includes a central portion having a first thickness, that is a maximum thickness in the first direction, and a peripheral portion having a thickness in the first direction that decreases toward an end thereof along the second direction, and
- the first epitaxial layer has a triangular shape or a quadrangular shape.

16. The semiconductor device as claimed in claim 15, wherein the second epitaxial layer includes carbon in a concentration of about 0.5 atomic % to about 4 atomic %.

17. The semiconductor device as claimed in claim 15, wherein in the horizontal sectional view along the plane passing through the source/drain region, the second epitaxial layer has a first surface, which is substantially flat, and a second surface, which is a curved surface that is bent from the first surface and is convex in a direction away from the gate structure.

* * * * *